US011683928B2

(12) United States Patent
Chen et al.

(10) Patent No.: US 11,683,928 B2
(45) Date of Patent: Jun. 20, 2023

(54) SEMICONDUCTOR DEVICE WITH SINGLE STEP HEIGHT

(71) Applicant: NANYA TECHNOLOGY CORPORATION, New Taipei (TW)

(72) Inventors: Hui-Lin Chen, Keelung (TW); Mao-Ying Wang, New Taipei (TW); Yu-Ting Lin, New Taipei (TW); Lai-Cheng Tien, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/538,068

(22) Filed: Nov. 30, 2021

(65) Prior Publication Data
US 2022/0122992 A1 Apr. 21, 2022

Related U.S. Application Data

(62) Division of application No. 17/074,873, filed on Oct. 20, 2020, now Pat. No. 11,309,316.

(51) Int. Cl.
H10B 12/00 (2023.01)
(52) U.S. Cl.
CPC .......... H10B 12/09 (2023.02); H10B 12/053 (2023.02); H10B 12/34 (2023.02); H10B 12/485 (2023.02); H10B 12/50 (2023.02)
(58) Field of Classification Search
None
See application file for complete search history.

(56) References Cited

U.S. PATENT DOCUMENTS

| 6,255,161 B1* | 7/2001 | Lin ................... H01L 27/10894 257/E21.59 |
| 11,088,140 B2* | 8/2021 | Huang .............. H01L 27/10814 |
| 2010/0237398 A1* | 9/2010 | Kamigaichi ...... H01L 27/11526 438/258 |
| 2012/0326267 A1 | 12/2012 | Song | |
| 2014/0256125 A1 | 9/2014 | Jang et al. | |
| 2015/0021684 A1* | 1/2015 | Lee .................... H01L 29/7838 438/270 |

FOREIGN PATENT DOCUMENTS

| TW | 201841350 A | 11/2018 |
| TW | 202036854 A | 10/2020 |

OTHER PUBLICATIONS

Office Action dated Aug. 15, 2022 related to Taiwanese Application No. 110130483.

* cited by examiner

Primary Examiner — Steven M Christopher
(74) Attorney, Agent, or Firm — Xuan Zhang

(57) ABSTRACT

The present application discloses a semiconductor device. The semiconductor device includes a substrate comprising an array area and a peripheral area adjacent to the array area; word line structures positioned in the array area; a word line hard mask layer positioned on the array area; a word line protection layer positioned on the word line hard mask layer; a gate electrode layer positioned on the peripheral area and separated from the word line hard mask layer and the word line protection layer; a peripheral protection layer positioned on the to gate electrode layer; and a first hard mask layer positioned over the array area and the peripheral area. A horizontal distance between the word line protection layer and the gate electrode layer is greater than or equal to three times of a thickness of the first hard mask layer.

8 Claims, 23 Drawing Sheets

SEMICONDUCTOR DEVICE WITH SINGLE STEP HEIGHT

CROSS-REFERENCE TO RELATED APPLICATION

This application is a divisional application of U.S. Non-Provisional application Ser. No. 17/074,873 filed on Oct. 20, 2020, which is incorporated herein by reference in its entirety.

TECHNICAL FIELD

The present disclosure relates to a semiconductor device, and more particularly, to a semiconductor device with a single step height.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating semiconductor device including providing a substrate including an array area and a peripheral area adjacent to the array area, forming word line structures and source/drain regions in the array area, and a word line protection layer on the array area, forming a first hard mask layer over the substrate and having a step height adjacent to a border between the array area and the peripheral area, forming a bit line contact in the array area and between the word line structures by using the first hard mask layer as a pattern guide, and forming a gate electrode layer on the peripheral area.

In some embodiments, the method for fabricating the semiconductor device includes a step of forming isolation structures in the substrate before the step of forming the word line structures, the source/drain regions, and the word line protection layer.

In some embodiments, the step of forming the word line structures includes forming word line trenches in the array area, conformally forming word line dielectric layers in the word line trenches, forming word line electrodes on the word line dielectric layers and in the word line trenches, forming a layer of capping material filled the word line trenches and covered the array area and the peripheral area, and removing the layer of capping material covered the peripheral area to turn the layer of capping material into word line capping layers and the word line protection layer. The word line dielectric layers, the word line electrodes, the word line capping layers together form the word line structures.

In some embodiments, the word line electrodes include bottom conductive layers and top conductive layers. The bottom conductive layers are formed on the word line dielectric layers and in the word line trenches, and the top conductive layers are formed on the bottom conductive layers.

In some embodiments, the bottom conductive layers are formed of polycrystalline silicon, polycrystalline germanium, or polycrystalline silicon germanium.

In some embodiments, the top conductive layers are formed of tungsten, aluminum, titanium, copper, titanium nitride, or a combination thereof.

In some embodiments, the word line dielectric layers are formed of silicon oxide, silicon nitride, silicon oxynitride, hafnium oxide, or zirconium oxide.

In some embodiments, the step of forming the word line trenches in the array area includes forming a word line hard mask layer covered the array area and the peripheral area, forming a first mask layer having a pattern of the word line structures on the word line hard mask layer, transferring the pattern of the word line structures onto the word line hard mask layer by forming word line openings in the word line hard mask layer, and performing a trench etch process to form the word line trenches.

In some embodiments, an etch rate ratio of the substrate to the word line hard mask layer is between about 100:1 and about 10:1 during the trench etch process.

In some embodiments, the word line hard mask layer is formed of silicon nitride.

In some embodiments, the bit line contact is formed of polycrystalline silicon, polycrystalline germanium, polycrystalline silicon germanium, tungsten, cobalt, zirconium, tantalum, titanium, aluminum, ruthenium, copper, metal carbides, metal nitrides, transition metal aluminides, or combinations thereof.

In some embodiments, the step of forming the bit line contact includes forming a bit line contact opening along the first hard mask layer and the word line protection layer and extending to the array area, forming a layer of first conductive material filled the bit line contact opening, and performing a planarization process until the word line hard mask layer is exposed to turn the layer of first conductive material into the bit line contact.

In some embodiments, the word line capping layers are formed of silicon oxide, silicon oxynitride, silicon nitride oxide, or a high-k material.

In some embodiments, the first hard mask layer is formed of a carbon film.

In some embodiments, a substrate temperature of forming the first hard mask layer is between about 100° C. and about 700° C.

In some embodiments, a pressure of forming the first hard mask layer is between 1 Torr and about 20 Torr.

In some embodiments, the step of forming the gate electrode layer on the peripheral area includes forming a layer of second conductive material over the array area and the peripheral area, forming a layer of insulating material on the layer of second conductive material, forming a mask layer (FIG. 20, 805) above the peripheral area and covered a portion of the layer of insulating material, performing an array etch process to turn the layer of second conductive material into the gate electrode layer on the peripheral area and turn the layer of insulating material into a peripheral protection layer on the gate electrode layer, and removing the peripheral protection layer.

In some embodiments, the gate electrode layer is formed of polycrystalline silicon, polycrystalline germanium, or polycrystalline silicon germanium.

In some embodiments, the peripheral protection layer is formed of silicon oxide, silicon nitride, or silicon nitride oxide.

Another aspect of the present disclosure provides a semiconductor device including a substrate including an array area and a peripheral area adjacent to the array area, word line structures positioned in the array area, a word line hard mask layer positioned on the array area, a word line protection layer positioned on the word line hard mask layer, a gate electrode layer positioned on the peripheral area and separated from the word line hard mask layer and the word line protection layer, a peripheral protection layer positioned on the gate electrode layer, and a first hard mask layer positioned over the array area and the peripheral area. A horizontal distance between the word line protection layer and the gate electrode layer is greater than or equal to three times of a thickness of the first hard mask layer.

Due to the design of the semiconductor device of the present disclosure, the stress during formation of the first hard mask layer may be alleviated or eliminated. As a result, the defects of the semiconductor device may be reduced. That is, the yield of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
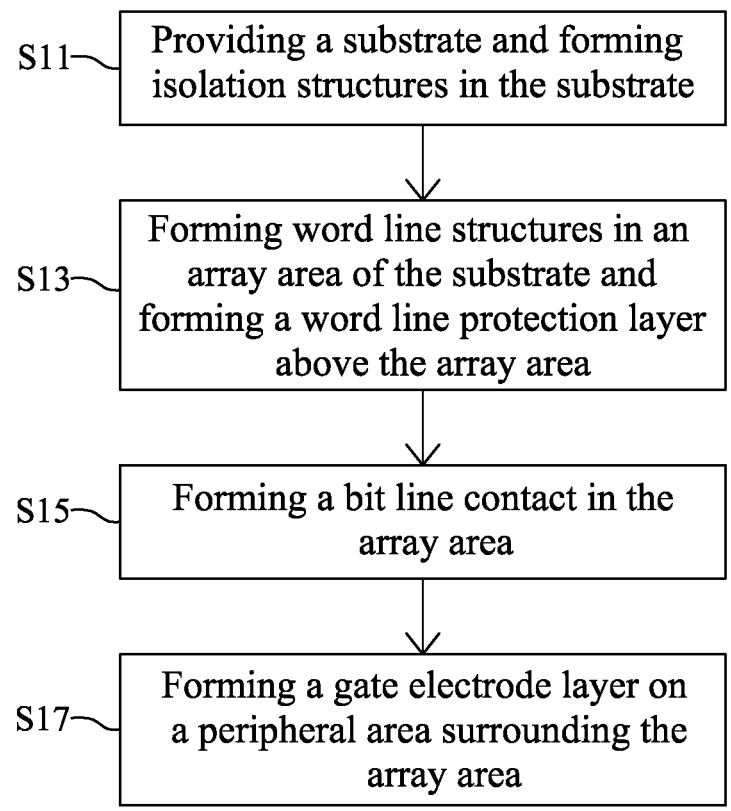
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 22 illustrate, in schematic cross-sectional view diagrams, a flow for fabricating the semiconductor device 1A in accordance with one embodiment of the present disclosure.

With reference to FIGS. 1 to 7, at step S11, a substrate 101 may be provided and isolation structures 201 may be formed in the substrate 101.

Figure 2:
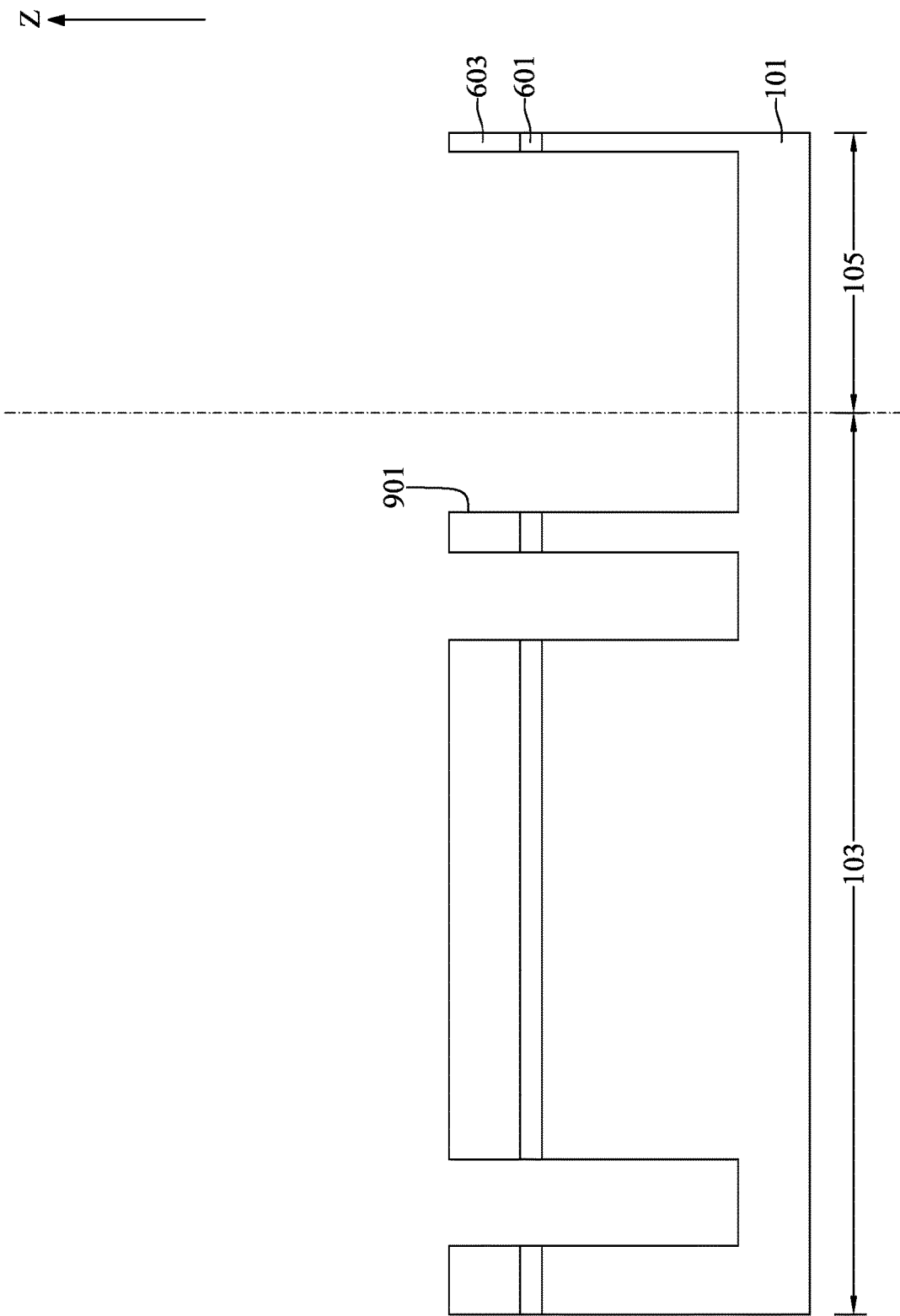
FIGS. 2 to 22 illustrate, in schematic cross-sectional view diagrams, a flow for fabricating the semiconductor device in accordance with one embodiment of the present disclosure.

With reference to FIG. 2, the substrate 101 may include an array area 103 and a peripheral area 105. The peripheral area 105 may surround the array area 103 in a top-view perspective (Not shown). The substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof.

It should be noted that, in the description of the present disclosure, the array area 103 may include a portion of the substrate 101 and a space above the portion of the substrate 101. Describing an element as being disposed on the array area 103 means that the element is disposed on a top surface of the portion of the substrate 101. Describing an element as being disposed above the array area 103 means that the element is disposed above the top surface of the portion of the substrate 101. In some embodiments, describing an element as being disposed in the array area 103 means that the element is disposed in the portion of the substrate 101; however, a top surface of the element may be substantially coplanar with the top surface of the portion of the substrate 101. In some embodiments, describing an element as being disposed in the array area 103 means that portions of the element is disposed in the substrate 101 and other portions of the element is disposed on or above the substrate 101. Accordingly, the peripheral area 105 may include another portion of the substrate 101 and a space above the other portion of the substrate 101.

With reference to FIG. 2, a series of deposition processes may be performed to deposit a pad oxide layer 601 and a pad nitride layer 603 on the substrate 101. The pad oxide layer 601 may be formed of, for example, silicon oxide. The pad nitride layer 603 may be formed of, for example, silicon nitride. A photolithography process may be performed to define positions of the isolation structures 201. After the photolithography process, an etch process, such as an anisotropic dry etch process, may be performed to form isolation structure trenches 901 along the pad oxide layer 601 and the pad nitride layer 603, and extending to the substrate 101. In some embodiments, the bottom surfaces of the isolation structure trenches 901 may be flat.

It should be noted that, in the description of the present disclosure, a surface of an element (a feature, an opening, or a trench) located at the highest vertical level along the direction Z is referred to as a top surface of the element. A surface of an element located at the lowest vertical level along the direction Z is referred to as a bottom surface of the element.

Figure 3:
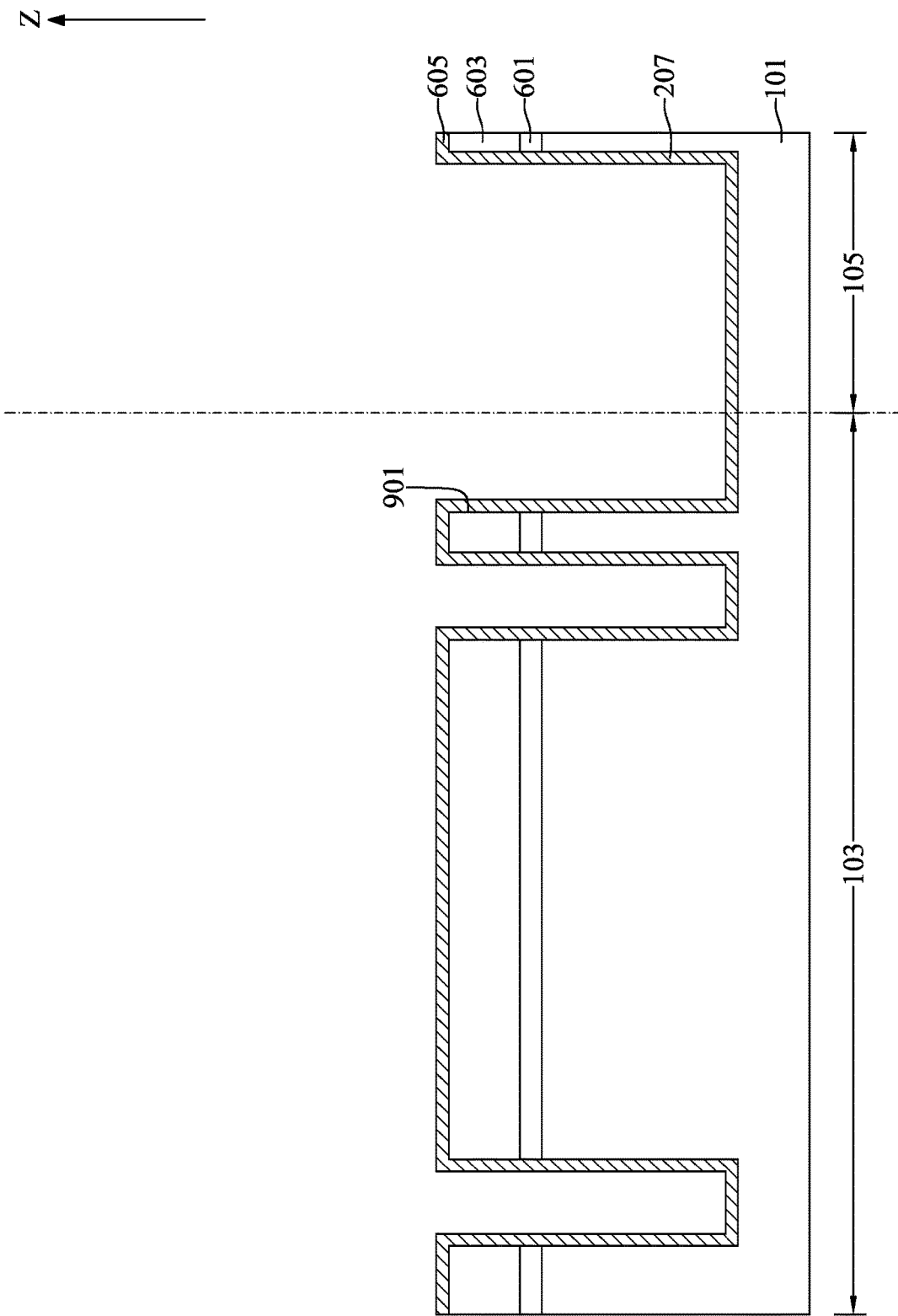

With reference to FIG. 3, a layer of first insulating material 605 may be formed over the intermediate semiconductor device illustrated in FIG. 2. The layer of first insulating material 605 may be conformally formed in the isolation structure trenches 901 and on the top surface of the pad nitride layer 603. In some embodiments, the first insulating material 605 may be, for example, silicon oxide, silicon oxy nitride, or silicon nitride oxide. The layer of first insulating material 605 may be formed by performing a deposition process that concurrently flows tetraethoxysilane and ozone to the intermediate semiconductor device illustrated in FIG. 2 or by performing a rapid thermal oxidation to the intermediate semiconductor device illustrated in FIG. 2 in an oxide/oxynitride atmosphere. The layer of first insulating material 605 may improve adhesion and reduce incidences of delamination and cracking during and after subsequent processing. In addition, the layer of first insulating material 605 may exhibit a smoother outer surface which may positively affect the deposition dynamics in subsequent processing.

Figure 4:
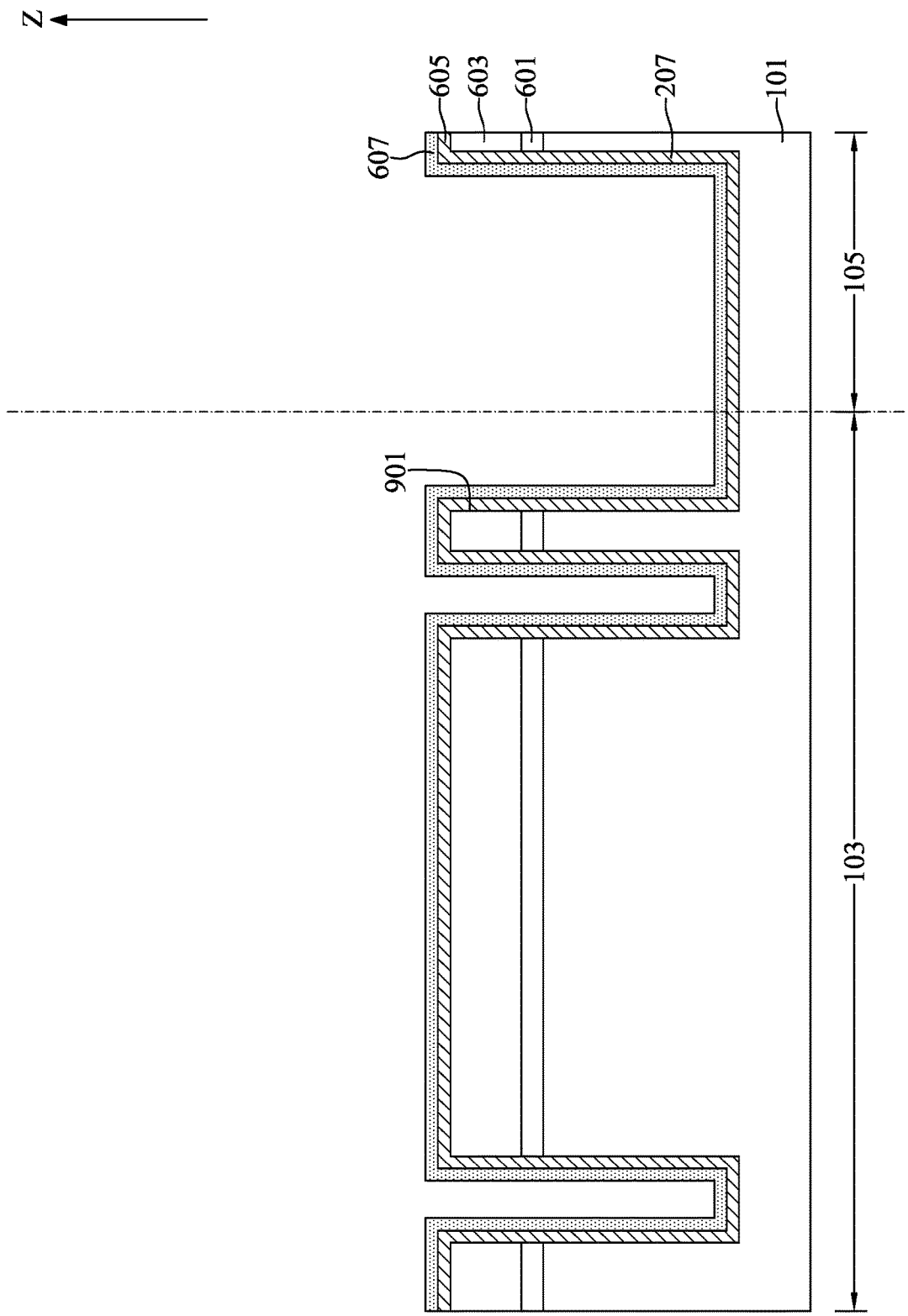

With reference to FIG. 4, a flowable layer 607 may be conformally formed on the layer of first insulating material 605. In some embodiments, the flowable layer 607 may include compounds having unsaturated bonding such as double bonds and triple bonds. The flowable layer 607 may be characterized as a soft jelly-like layer, a gel having liquid flow characteristics, or a liquid layer but is not limited thereto. The flowable layer 607 may flow into and fill small substrate gaps without forming voids or weak seams.

Figure 5:
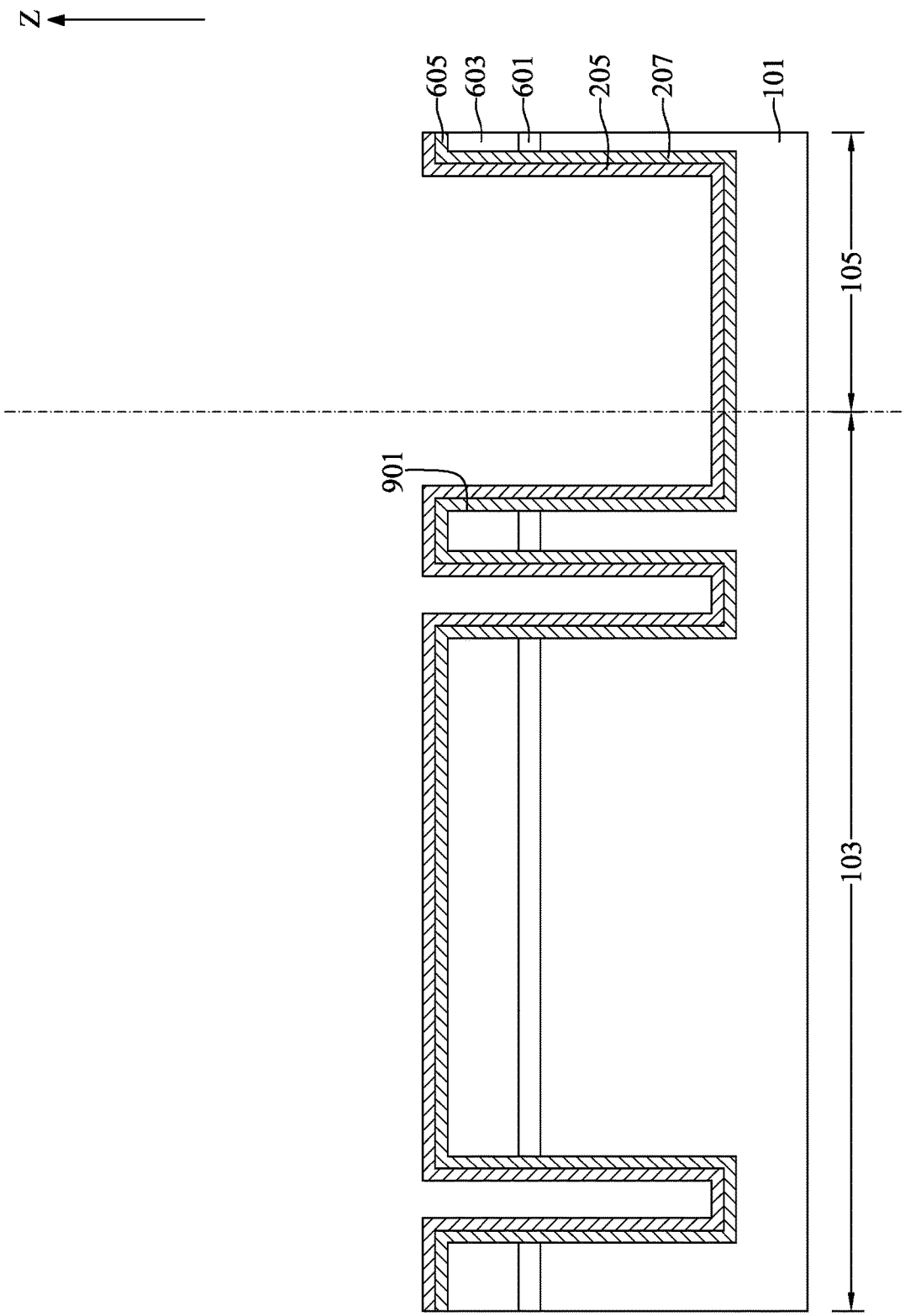

With reference to FIG. 5, a thermal process may be performed to transform the flowable layer 607 into a treated flowable layer 205 by solidifying the flowable layer 607. The thermal process may break the unsaturated bonding into radicals, and the compounds may cross-link through the radicals. As a result, the flowable layer 607 may be solidified. In some embodiments, the volume of the flowable layer 607 may be reduced during the thermal process. Hence, the treated flowable layer 205 may have greater density comparing to the flowable layer 607.

Alternatively, in some embodiments, the flowable layer 607 may be formed by reacting vapor phase precursors with co-reactants. The flowable layer 607 may have flow characteristics that can provide consistent fill of substrate gaps of the substrate 101. Subsequently, a post-deposition treatment may be performed, and the flowable layer 607 may be physically densified and/or chemically converted to reduce its flowability. After the post-deposition treatment, the flowable layer 607 may be turned into the treated flowable layer 205. In some embodiments, the densified flowable layer 607 may be considered to be solidified. In some embodiments, physically densifying the flowable layer 607 may involve shrinking the flowable layer 607. In some embodiments, the treated flowable layer 205 may not be shrunk as compared to the flowable layer 607. In some embodiments, the post-deposition treatment may involve substituting chemicals in the flowable layer 607, which may result in denser, higher volume treated flowable layer 205.

In some embodiments, the flowable layer 607 may be flowable silicon oxide, silicon nitride, or silicon oxynitride. In some embodiments, the flowable layer 607 may be silicon carbide or silicon oxycarbide. In some embodiments, chamber pressure for formation of the flowable layer 607 may be between about 1 Torr and about 200 Torr, between about 10 Torr and about 75 Torr, or about 10 Torr. In some embodiments, a substrate temperature for formation of the flowable layer 607 may be between about −20° C. and about 100° C., between about −20° C. and about 30° C., or between about −10° C. and about 10° C.

In some embodiments, the vapor phase precursors may include silicon containing precursors or carbon containing precursors. The co-reactants may include oxidants, catalysts, surfactants, or inert carrier gases.

The silicon containing precursors may include, but are not limited to, silane, disilane, trisilane, hexasilane, cyclohexasilane, alkoxysilanes, aminosilanes, alkylsilanes, tetraisocyanatesilane (TICS), hydrogen silsesquioxane, T8-hydridospherosiloxane, or 1,2-dimethoxy-1,1,2,2-tetramethyldisilane.

The alkoxysilanes may include tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilyl)ethane, tri-t-butoxylsilanol, hexamethoxydisilane (HMODS), hexaethoxydisilane (HEODS), or tert-butoxydisilane. The aminosilanes may include bis-tert-butylamino silane (BTBAS) or tris(dimethylamino)silane.

The carbon containing precursors may include, but are not limited to, trimethylsilane (3MS), tetramethylsilane (4MS), diethoxymethylsilane (DEMS), dimethyldimethoxysilane, methyl-triethoxysilane (MTES), methyl-trimethoxysilane, methyl-diethoxysilane, methyl-dimethoxysilane, trimethoxymethylsilane, dimethoxymethylsilane, or bis(trimethylsilyl)carbodiimide.

The oxidants may include, but are not limited to, ozone, hydrogen peroxide, oxygen, water, alcohols, nitric oxide, nitrous dioxide, nitrous oxide, carbon monoxide, or carbon dioxide. The alcohols may include, for example, methanol, ethanol, or isopropanol.

The catalysts may include, but are not limited to, proton donor catalysts, halogen-containing compounds, mineral acids, bases, chloro-diethoxysilane, methanesulfonic acid, trifluoromethanesulfonic acid, chloro-dimethoxysilane, pyridine, acetyl chloride, chloroacetic acid, dichloroacetic acid, trichloroacetic acid, oxalic acid, benzoic acid, or triethylamine. The proton donor catalysts may include nitric acid, hydrofluoric acid, phosphoric acid, sulphuric acid, hydrochloric acid, bromic acid, carboxylic acid derivatives, ammonia, ammonium hydroxide, hydrazine, or hydroxylamine. The halogen-containing compounds may include dichlorosilane, trichlorosilane, methylchlorosilane, chlorotriethoxysilane, chlorotrimethoxysilane, chloromethyldiethoxysilane, chloromethyldimethoxysilane, vinyltrichlorosilane, diethoxydichlorosilane, or hexachlorodisiloxane. The mineral acids may include formic acid or acetic acid. The bases may include phosphine.

The surfactants may include solvents, alcohols, ethylene glycol, or polyethylene glycol. The surfactants may be used to relieve surface tension and increase wetting of reactants on the substrate surface. The surfactants may also increase the miscibility of the vapor phase precursors with the other reactants.

The solvents may be non-polar or polar and protic or aprotic. The solvents may be matched to the choice of vapor phase precursors to improve the miscibility in the oxidants. Non-polar solvents may include alkanes and alkenes; polar aprotic solvents may include acetones and acetates; and polar protic solvents may include alcohols and carboxylic compounds.

The inert carrier gases may include nitrogen, helium, or argon.

The post-deposition treatment may cross-link and remove terminal groups such as —OH and —H groups in the flowable layer 607, therefore increase the density and hardness of the treated flowable layer 205. The post-deposition treatment may be thermal curing, exposure to a downstream or direct plasma, exposure to ultraviolet or microwave radiation, or exposure to another energy source.

While using thermal curing as the means of the post-deposition treatment, the temperature of thermal curing may be between about 200° C. and 600° C. The post-deposition treatment may be performed in an inert environment, an oxidizing environment, a nitridizing environment, or a mix of oxidizing and nitridizing environment. The inert environment may include argon or helium. The oxidizing environment may include oxygen, ozone, water, hydrogen peroxide, nitrous oxide, nitric oxide, nitrogen dioxide, carbon monoxide, carbon dioxide. The nitridizing environment may include nitrogen, ammonia, nitrous oxide, nitric oxide, nitrogen dioxide. The pressure of thermal curing may be between about 0.1 Torr and about 10 Torr.

While using the exposure to a downstream or direct plasma as the means of the post-deposition treatment, the plasma may be an inert plasma or a reactive plasma. The inert plasma may be helium and argon plasma. The reactive plasma may be oxidizing plasma including oxygen and steam, or hydrogen-containing plasma including hydrogen and a diluent such as inert gas. In some embodiments, the temperature during plasma exposure may be about 25° C. or higher. In some embodiments, the temperature during plasma exposure may be between about −15° C. and about 25° C.

Figure 6:
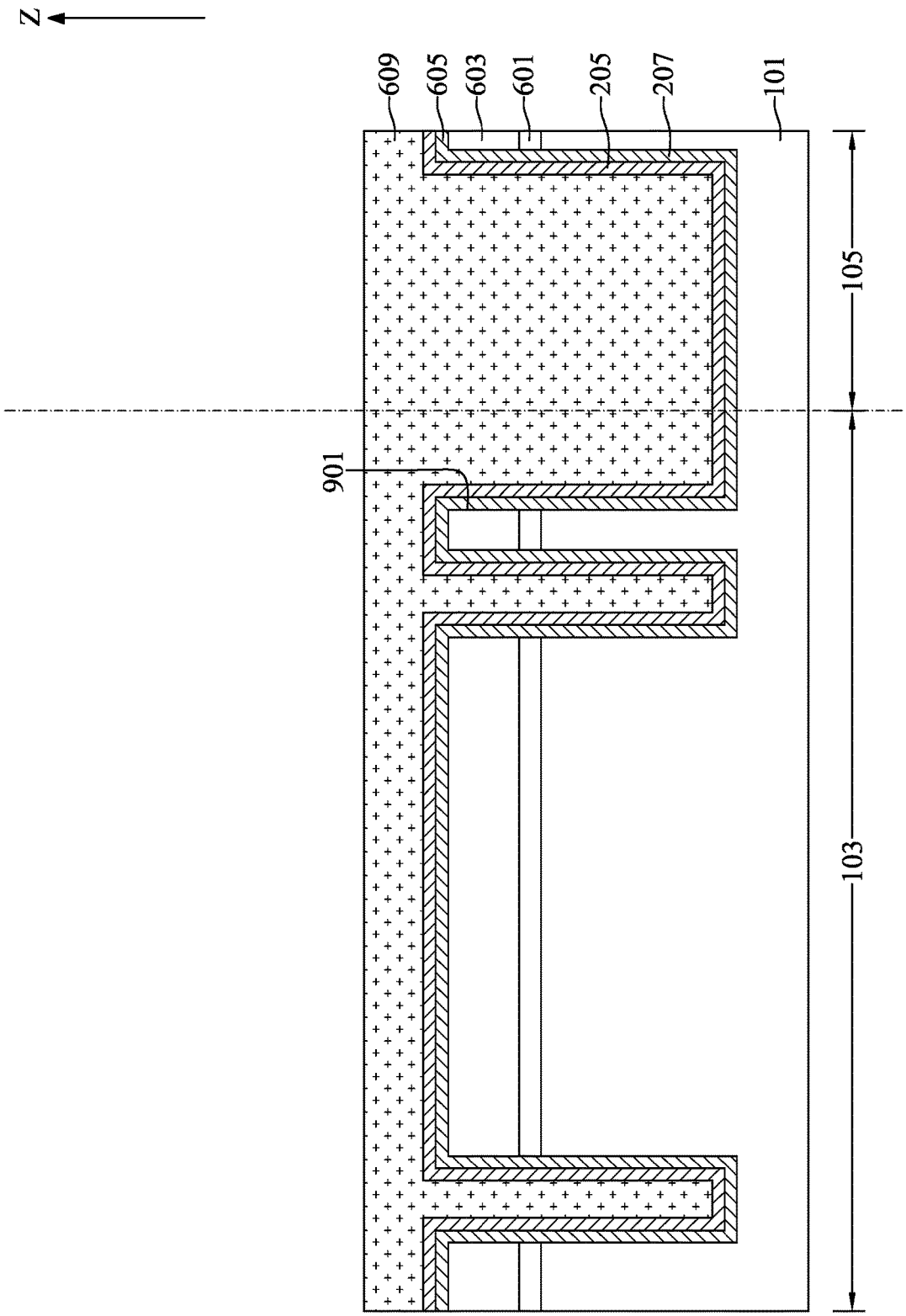

With reference to FIG. 6, a high aspect ratio process may be performed to deposit a layer of second insulating material 609 on the treated flowable layer 205. The layer of second insulating material 609 may completely fill the isolation structure trenches 901. The second insulating material 609 may be, for example, silicon oxide, silicon nitride, silicon oxynitride, silicon nitride oxide, or fluoride-doped silicate.

The high aspect ratio process may include a first stage and a second stage. The first stage may have a low deposition rate to ensure a more even trench fill with a reduced chance of forming voids. The second stage may have a rapid deposition rate to increase overall production efficiency by decreasing the deposition time. The high aspect ratio process may include both a slower deposition rate stage when the slower deposition rate is advantageous for reducing defects, and a higher deposition rate stage when the high deposition rate results in shorter deposition times.

In some embodiments, a two stage anneal may be performed after the formation of the layer of second insulating material 609. The first stage of the two stage anneal may be proceeded at a lower temperature in an environment that includes one or more oxygen containing species such as water, oxygen, nitric oxide, or nitrous oxide. The first stage of the two stage anneal may rearrange and strengthen the silicon oxide network to prevent the formation of voids and opening of weak seams in the trenches. In addition, the lower temperature of the first stage of the two stage anneal may keep the oxygen from reacting with the trench walls and other portions of the substrate 101 to form undesirable oxide layers.

The second stage of the two stage anneal may be subsequently proceeded at the higher temperature in an environment that lacks oxygen. The second stage of the two stage anneal may rearrange the structure of the second insulating material 609 and drive out moisture, both of which increase the density of the second insulating material 609. The environment may be, for example, substantially pure nitrogen, a mixture of nitrogen and noble gases (e.g., helium, neon, argon, or xenon), or a substantially pure noble gas. The environment may also include reducing gases such as hydrogen or ammonia. The second stage of the two stage anneal may facilitate the high-temperature densification without the oxidation of the substrate 101.

Figure 7:
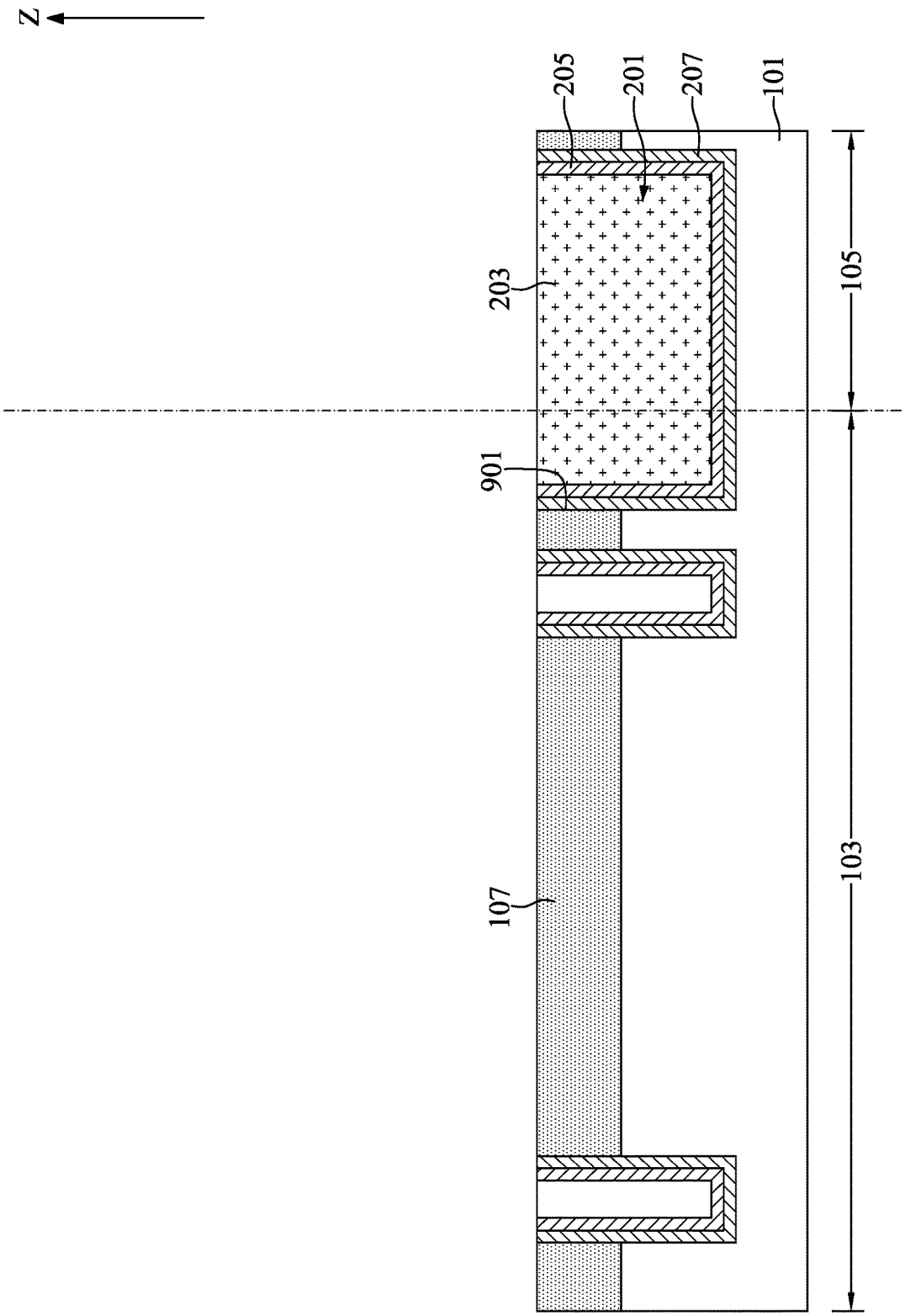

With reference to FIG. 7, a planarization process, such as chemical mechanical polishing, may be performed until the top surface of the substrate 101 is exposed to remove excess material, provide a substantially flat surface for subsequent processing steps, and concurrently form isolation layers 203 in the isolation structure trenches 901. After the planarization process, the layer of first insulating material 605 may be turned into adhesion layers 207 in the isolation structure trenches 901. The treated flowable layer 205 may be divided into multiple segments and disposed in the isolation structure trenches 901, respectively. The adhesion layers 207, the treated flowable layers 205, and the isolation layers 203 together form the isolation structures 201. The treated flowable layer 205 may fill small substrate gaps without forming voids or weak seams. Therefore, the yield of the semiconductor device 1A may be improved.

With reference to FIG. 7, an implantation may be performed to form an impurity region 107 in the substrate 101. The impurity region 107 may be doped with a dopant such as phosphorus, arsenic, antimony, or boron.

With reference to FIG. 1 and FIGS. 8 to 14, at step S13, word line structures 301 may be formed in the array area 103 and a word line protection layer 313 may be formed above the array area 103.

Figure 8:
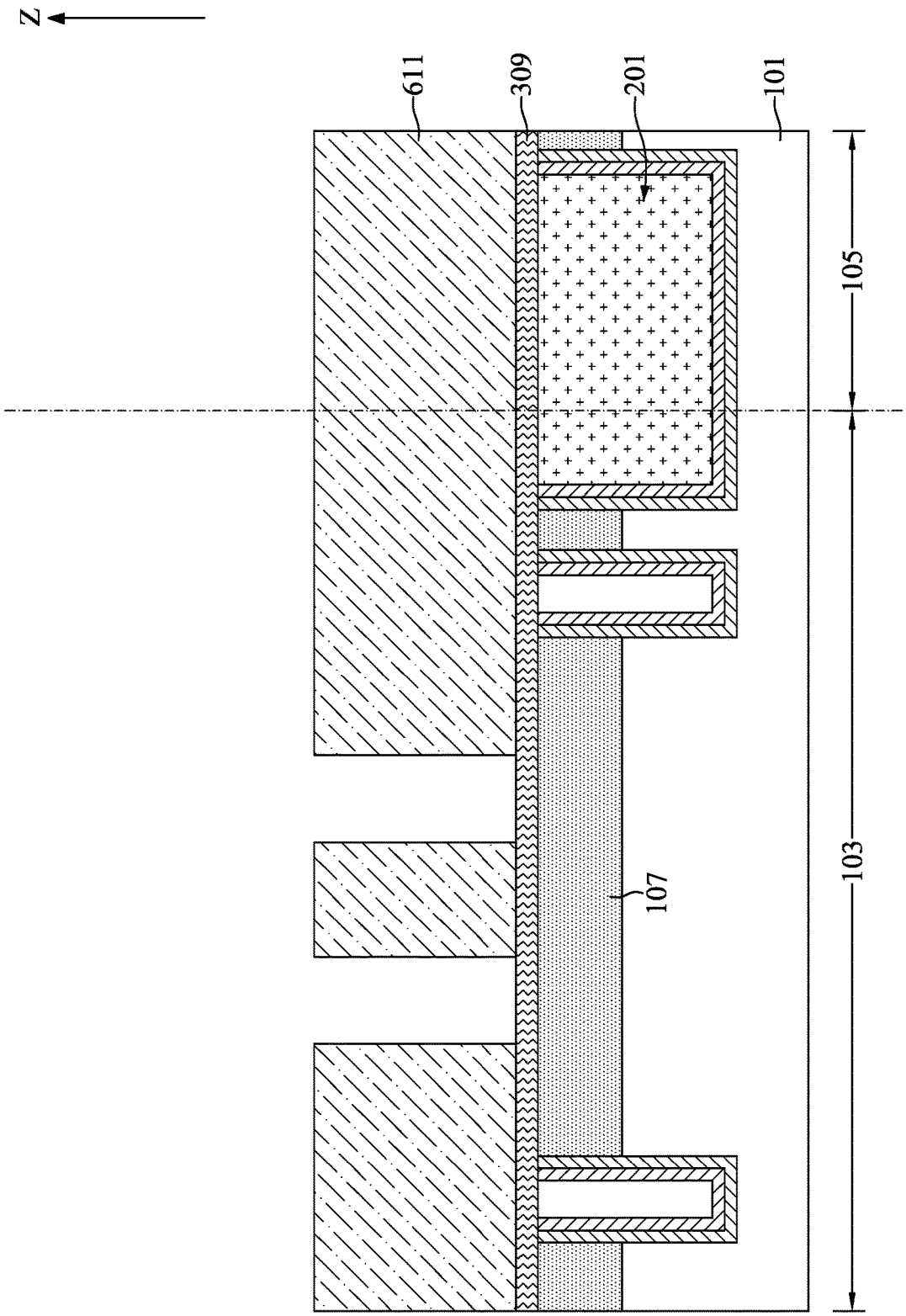

With reference to FIG. 8, a word line hard mask layer 309 may be formed on the array area 103 and the peripheral area 105. The word line hard mask layer 309 may be formed of, for example, silicon nitride but is not limited thereto. A first mask layer 611 may be formed on the word line hard mask layer 309. The first mask layer 611 may be a photoresist layer and may have a pattern of the word line structures 301.

Figure 9:
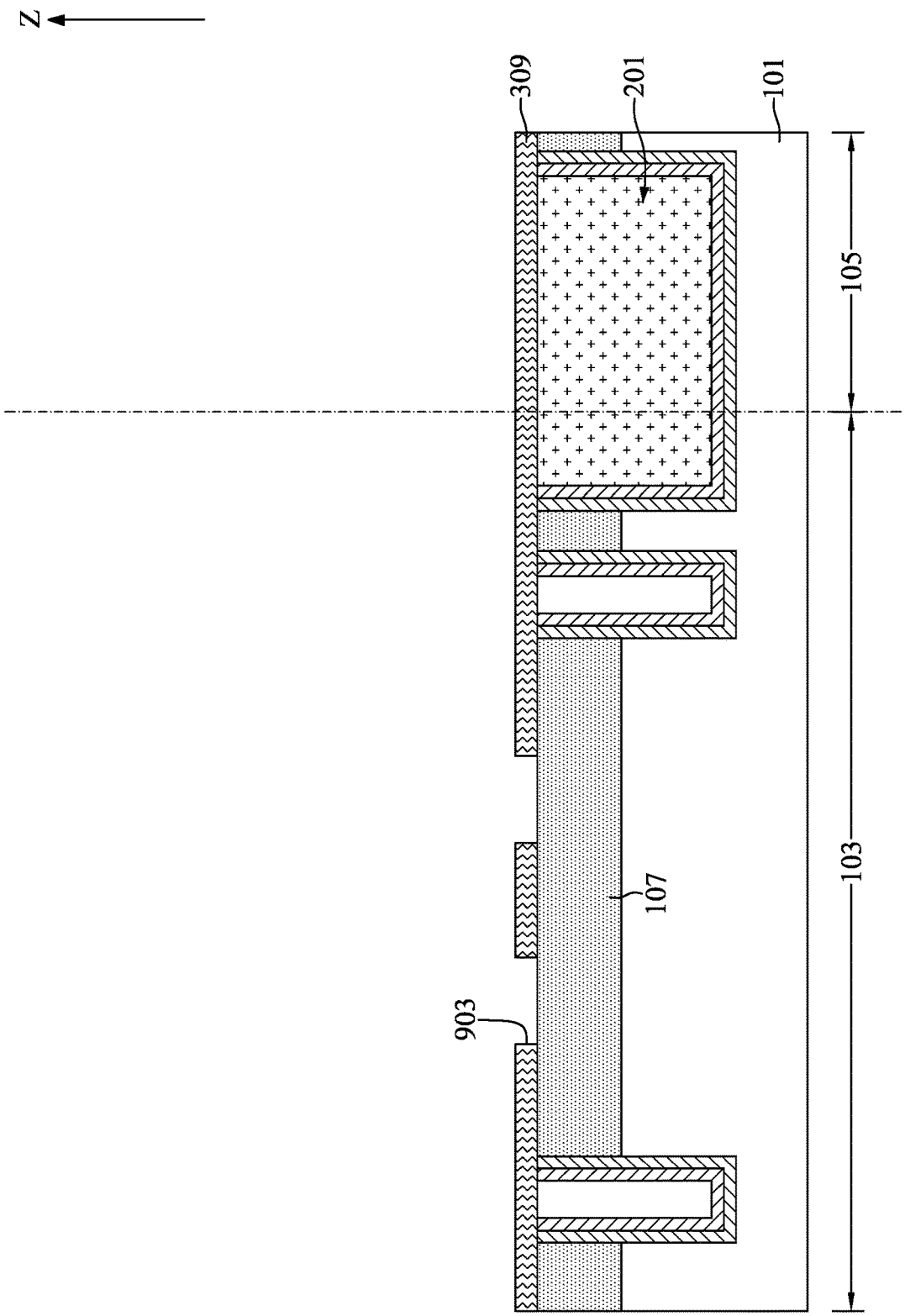

With reference to FIG. 9, a first hard mask etch process, such as an anisotropic dry etch process, may be performed to form word line openings 903 in the word line hard mask layer 309. The word line openings 903 may be formed according to the pattern of the word line structures 301. The etch rate ratio of the word line hard mask layer 309 to the substrate 101 may be about 100:1 and about 10:1 during the first hard mask etch process. Specifically, the etch rate ratio of the word line hard mask layer 309 to the substrate 101 may be about 20:1 and about 10:1 during the first hard mask etch process.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

Figure 10:
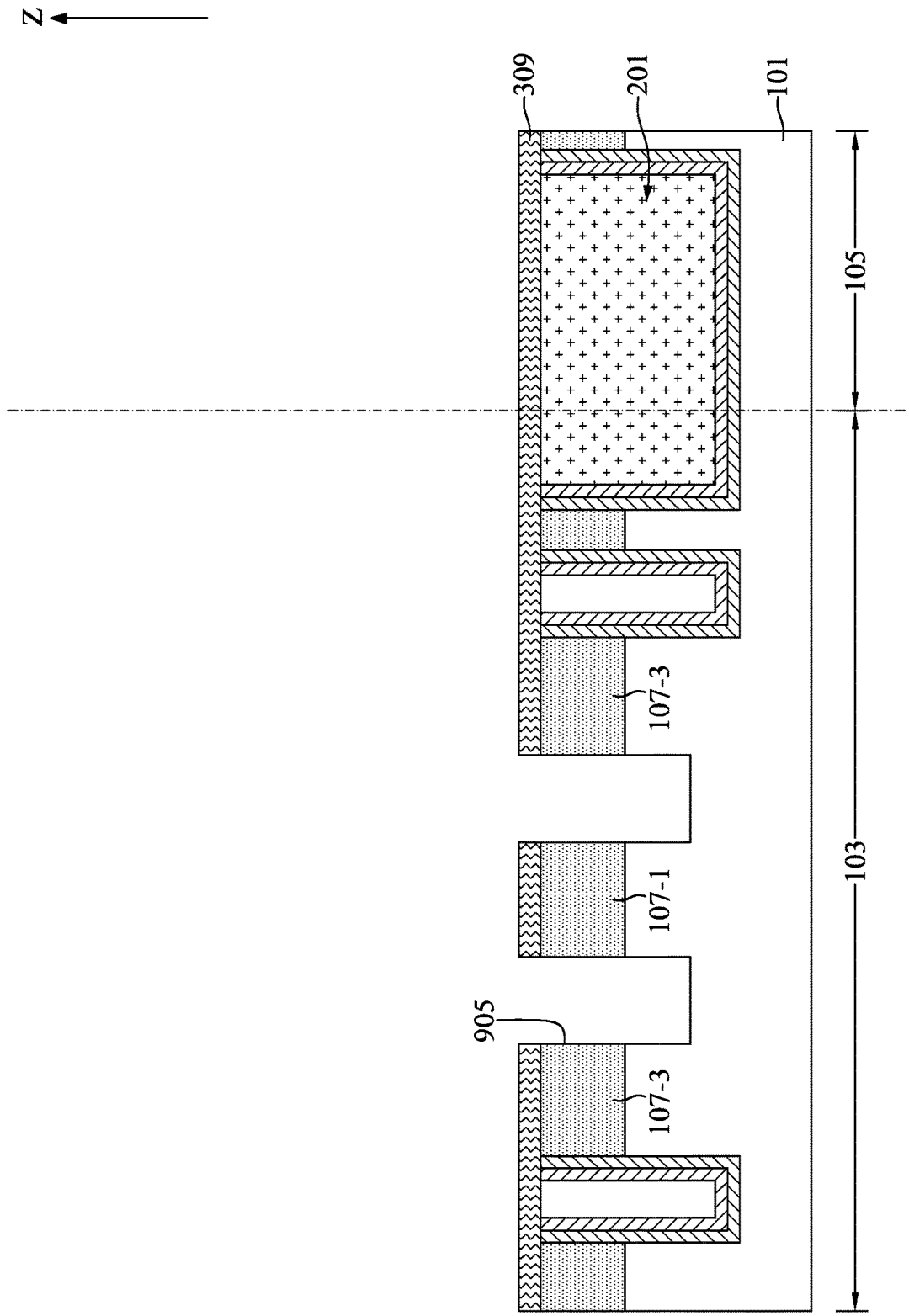

With reference to FIG. 10, a first trench etch process may be performed to extend the word line openings 903 to the array area 103 and turn the word line openings 903 into word line trenches 905. The etch rate ratio of the substrate 101 to the word line hard mask layer 309 may be about 100:1 and about 10:1 during the first trench etch process. Specifically, the etch rate ratio of the substrate 101 to the word line hard mask layer 309 may be about 20:1 and about 10:1 during the first trench etch process.

In some embodiments, the bottom surface of the word line trenches 905 may be flat. In some embodiments, the bottom surface of the word line trenches 905 may be rounded to reduce defect density and reduce electric field concentration during the operating of the semiconductor device 1A. Corner effects may be avoided if the word line trenches 905 have rounded bottom surfaces. The word line trenches 905 may divide the impurity region 107 into source/drain regions 107-1, 107-3.

Figure 11:
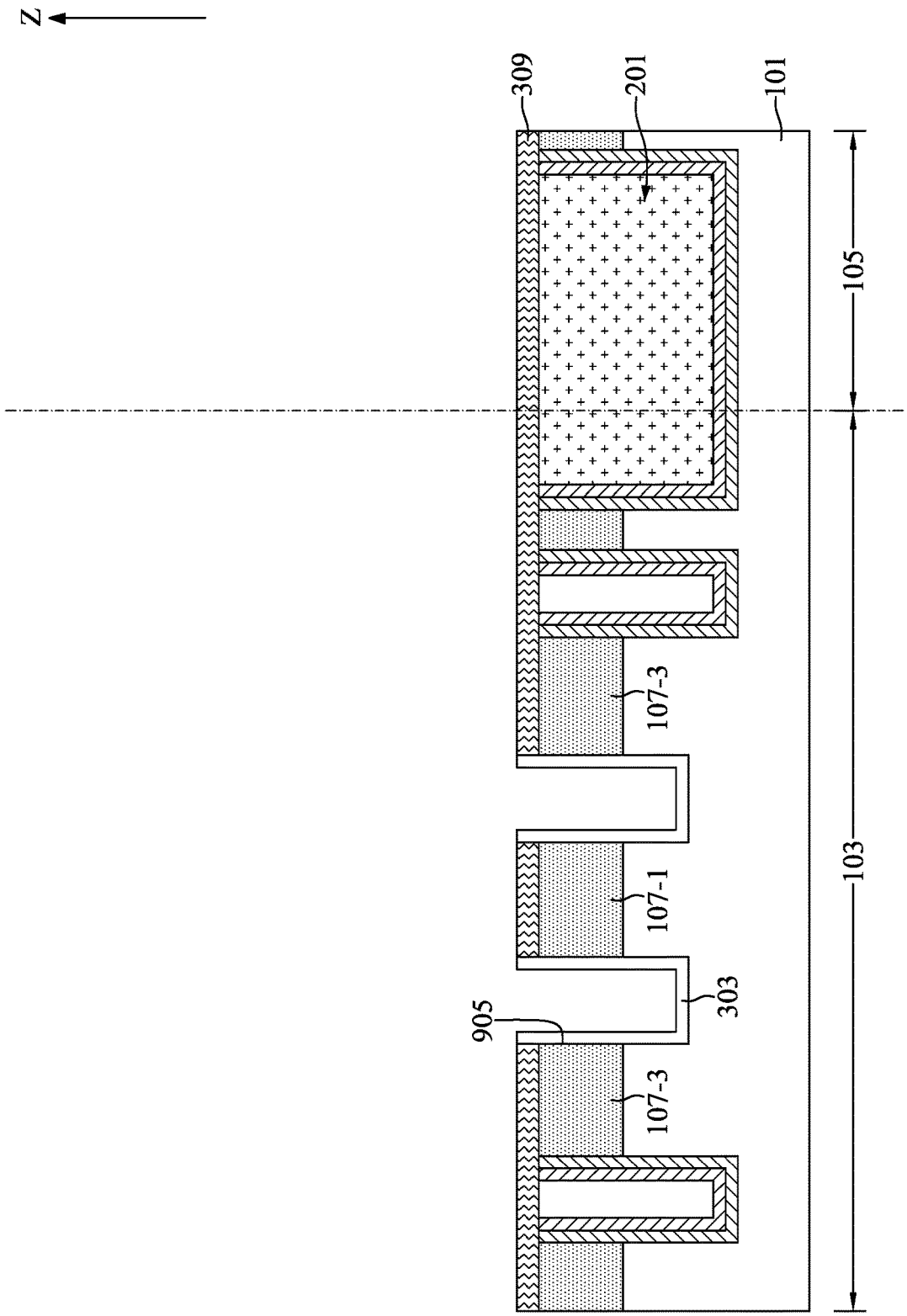

With reference to FIG. 11, word line dielectric layers 303 may be conformally formed in the word line trenches 905. The word line dielectric layers 303 may have U-shaped cross-sectional profiles. In some embodiments, the word line dielectric layers 303 may be formed by a thermal oxidation process. For example, the word line dielectric layers 303 may be formed by oxidizing the bottom and side walls of the word line trenches 905.

In some embodiments, the word line dielectric layers 303 may be formed by a deposition process such as chemical vapor deposition or atomic layer deposition. The word line dielectric layers 303 may include a high-k material, an oxide such as silicon oxide, a nitride such as silicon nitride, an oxynitride such as silicon oxy nitride, or combinations thereof. The high-k material may include a hafnium-containing material. The hafnium-containing material may be, for example, a hafnium oxide, a hafnium silicon oxide, a hafnium silicon oxynitride, or combinations thereof. In some embodiments, the high-k material may be, for example, a lanthanum oxide, a lanthanum aluminum oxide, a zirconium oxide, a zirconium silicon oxide, a zirconium silicon oxynitride, an aluminum oxide, and combinations thereof.

While the word line dielectric layer 303 is formed of the high-k material, an interfacial layer (Not shown) may be formed between the substrate 101 and the word line dielectric layer 303. The interfacial layer may be formed of, for example, silicon oxide. The interfacial layer may have a thickness between about 7 angstroms and about 12 angstroms, or between about 8 angstroms and about 10 angstroms. The interfacial layer may facilitate the formation of the word line dielectric layer 303 and improve the adhesion between the substrate 101 and the word line dielectric layer 303.

Figure 12:
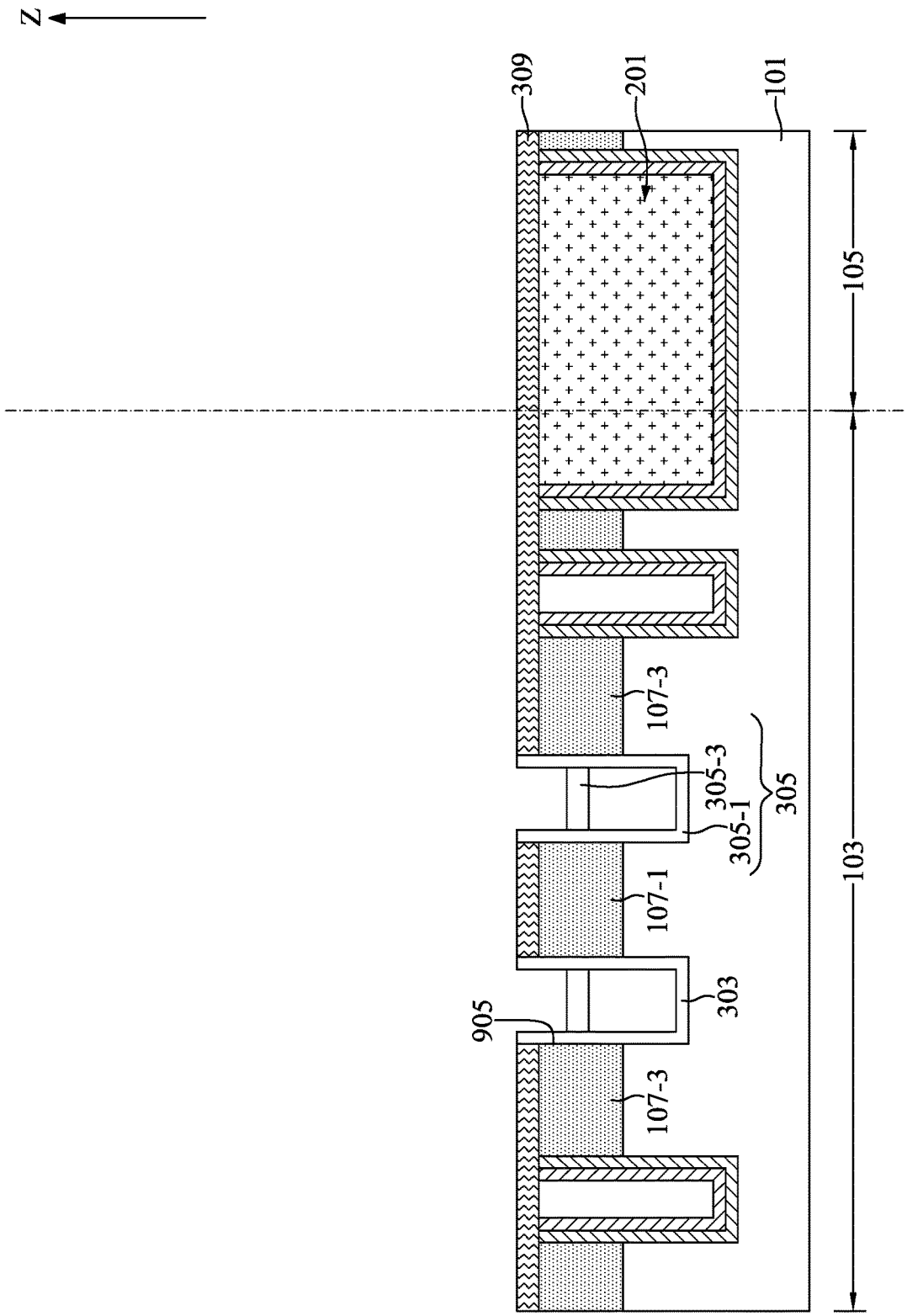

With reference to FIG. 12, word line electrodes 305 may be respectively correspondingly formed on the word line dielectric layers 303 and in the word line trenches 905. For convenience of description, only one word line electrode 305 is described. The word line electrode 305 may include a bottom conductive layer 305-1 and a top conductive layer 305-3. The bottom conductive layer 305-1 may be formed on the word line dielectric layer 303 and in the word line trenches 905. The top conductive layer 305-3 may be formed on the bottom conductive layer 305-1 and in the word line trenches 905. The top surface of the top conductive layer 305-3 may be at a vertical level lower than the top surface of the substrate 101.

The bottom conductive layer 305-1 may be formed of, for example, polycrystalline silicon, polycrystalline germanium, polycrystalline silicon germanium, the like, or a combination thereof. In some embodiments, the bottom conductive layer 305-1 may be doped with a dopant such as phosphorus, arsenic, antimony, or boron. The top conductive layer 305-3 may be formed of, for example, tungsten, aluminum, titanium, copper, titanium nitride, the like, or a combination thereof.

In some embodiments, a silicide layer may be formed between the bottom conductive layer 305-1 and the top conductive layer 305-3. The silicide layer may have a thickness between about 2 nm and about 20 nm. The silicide layer may be formed of, for example, titanium silicide, nickel silicide, nickel platinum silicide, tantalum silicide, or cobalt silicide. The silicide layer may reduce the contact resistance between the bottom conductive layer 305-1 and the top conductive layer 305-3.

In some embodiments, an annealing process may be performed to activate the source/drain regions 107-1, 107-3. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal. The word line dielectric layer 303 may prevent junction leakage and prevent dopants in the source/drain regions 107-1, 107-3 from migrating into the word line electrode 305.

Figure 13:
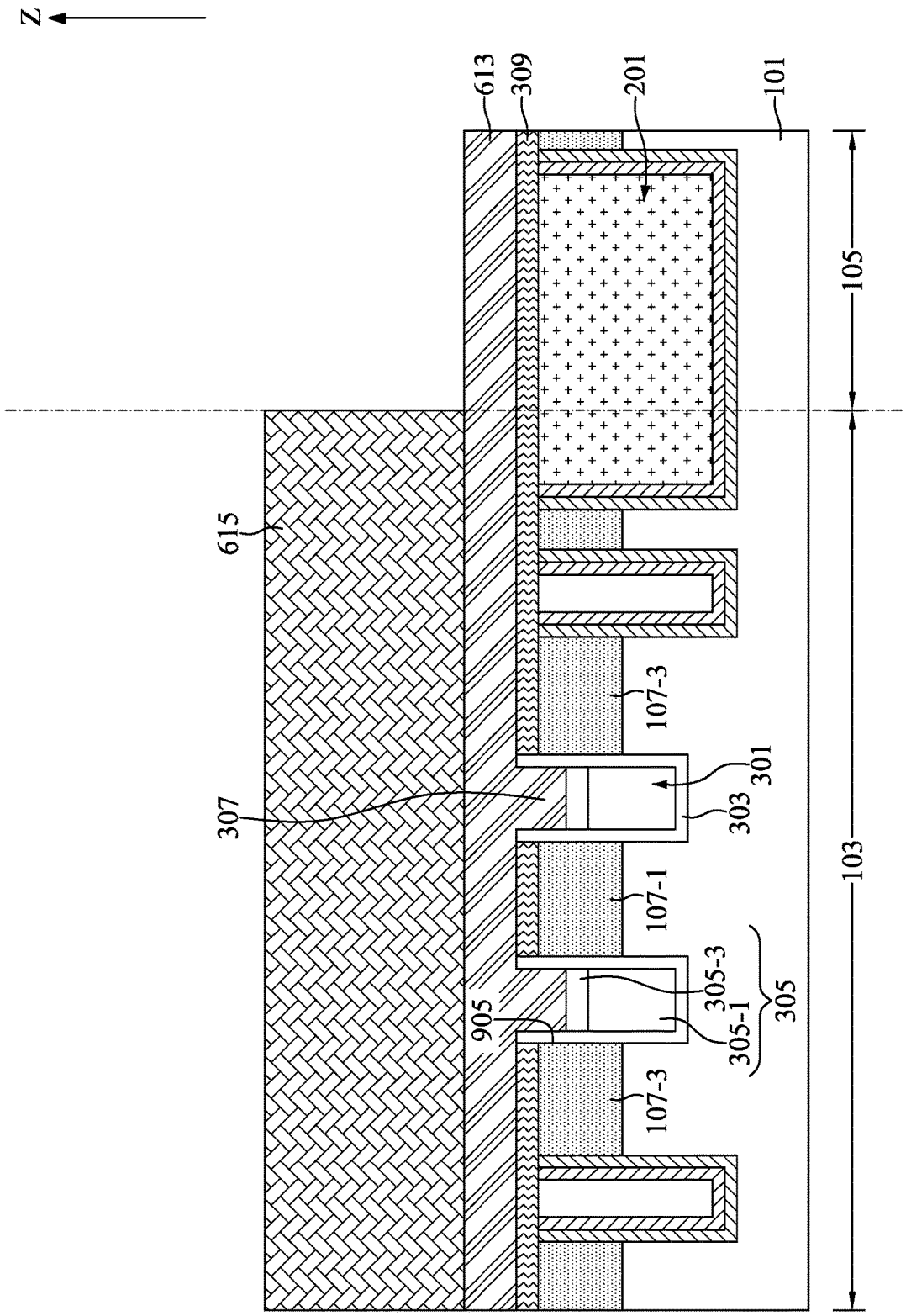

With reference to FIG. 13, a layer of capping material 613 may be formed to completely fill the word line trenches 905 and cover the array area 103 and the peripheral area 105. The layer of capping material 613 filled in the word line trenches 905 may be referred to as word line capping layers 307. The capping material 613 may be, for example, silicon oxide, silicon oxynitride, silicon nitride oxide, a high-k material such as metal oxide, metal nitride, metal silicate, transition metal-oxide, transition metal-nitride, transition metal-silicate, oxynitride of metal, metal aluminate, zirconium silicate, zirconium aluminate, or a combination thereof. A second mask layer 615 may be formed on the layer of capping material 613 and covered the array area 103. The second mask layer 615 may be a photoresist layer.

Figure 14:
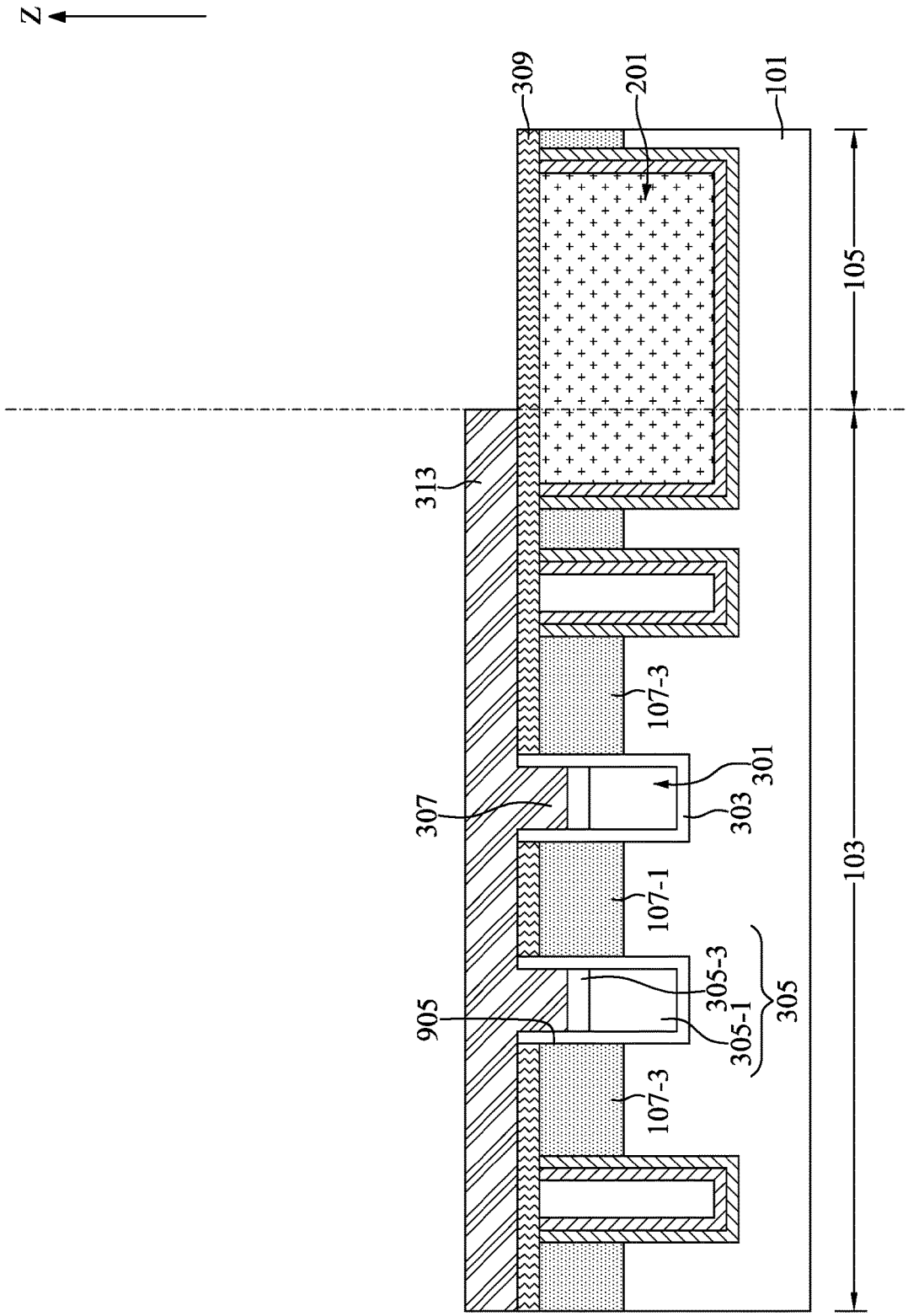

With reference to FIG. 14, a peripheral etch process may be performed to remove the layer of capping material 613 formed above the peripheral area 105 and the word line hard mask layer 309 formed on the peripheral area 105. After the peripheral etch process, the layer of capping material 613 may be turned into a word line protection layer 313 formed on the word line hard mask layer 309. The word line dielectric layers 303, the word line electrodes 305, and the word line capping layers 307 together form the word line structures 301.

With reference to FIG. 1 and FIGS. 15 to 19, at step S15, a bit line contact 401 may be formed in the array area 103.

Figure 15:
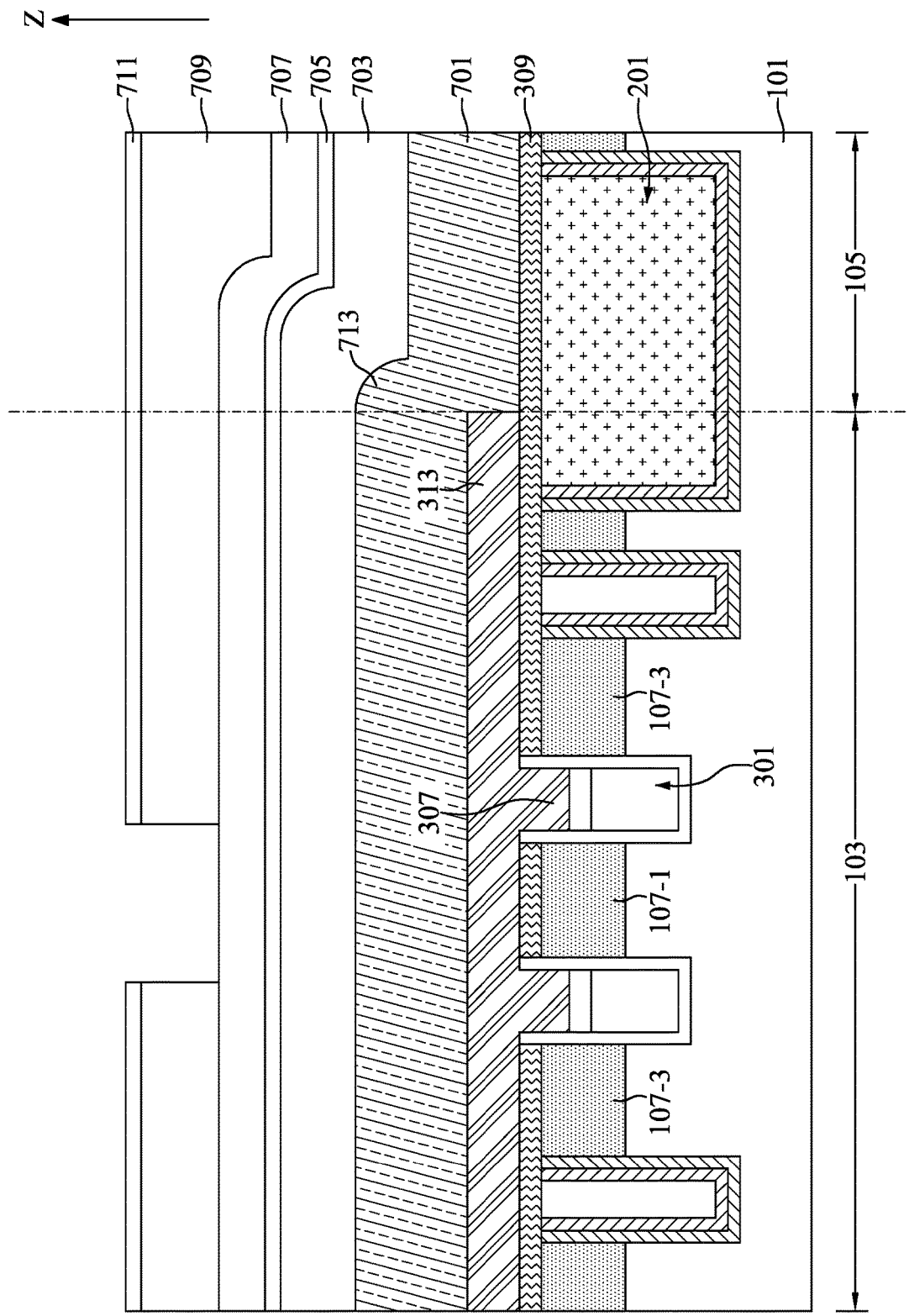

With reference to FIG. 15, a first hard mask layer 701 may be formed over the array area 103 and the peripheral area 105. The first hard mask layer 701 may cover the word line protection layer 313. A step height 713 may be formed adjacent to the border between the array area 103 and the peripheral area 105 due to the presence of the word line protection layer 313 and the word line hard mask layer 309.

In the present embodiment, during the formation of the first hard mask layer 701, there is no element existed on or above the peripheral area 105; hence, the stress originating from the step height 713 may not accumulate during the formation of the first hard mask layer 701. As a result, the first hard mask layer 701 may be formed without defects such as cracks.

In some embodiments, the first hard mask layer 701 may be formed of, for example, a carbon film. The terms "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. These terms do include, for example, graphite, charcoal and halocarbons.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof. In some embodiments, partially or completely fluorinated derivatives of the hydrocarbon compounds may be used. The doped derivatives include boron-containing derivatives of the hydrocarbon compounds as well as fluorinated derivatives thereof.

In some embodiments, the carbon film may be deposited from the processing gas mixture by maintaining a substrate temperature between about 100° C. and about 700° C.; specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance properties, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch selectivity and chemical mechanical polishing resistance properties. As the hydrogen content decreases, the etch resistance, and thus the selectivity, of the carbon film increases. The reduced rate of removal of the carbon film may make the carbon film suitable for being a mask layer when performing an etch process to transfer desire pattern onto the underlying layers.

With reference to FIG. 15, a second hard mask layer 703, a third hard mask layer 705, a fourth hard mask layer 707, a third mask layer 709, and an anti-reflective coating layer 711 may be sequentially formed over the first hard mask layer 701. The second hard mask layer 703 may be formed of, for example, silicon nitride but is not limited thereto. The third hard mask layer 705 and the fourth hard mask layer 707 may be formed of, for example, silicon oxynitride or silicon nitride oxide but are not limited thereto. The oxygen and nitrogen proportions of the second hard mask layer 703 may be different from the oxygen and nitrogen proportions of the third hard mask layer 705.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

The third mask layer 709 may be a photoresist layer. The anti-reflective coating layer 711 may improve the performance when a photolithography process is performing on the third mask layer 709. In some embodiments, the anti-reflective coating layer 711 may be formed between the fourth hard mask layer 707 and the third mask layer 709. The third mask layer 709 and the anti-reflective coating layer 711 may have a pattern of the bit line contact 401.

Figure 16:
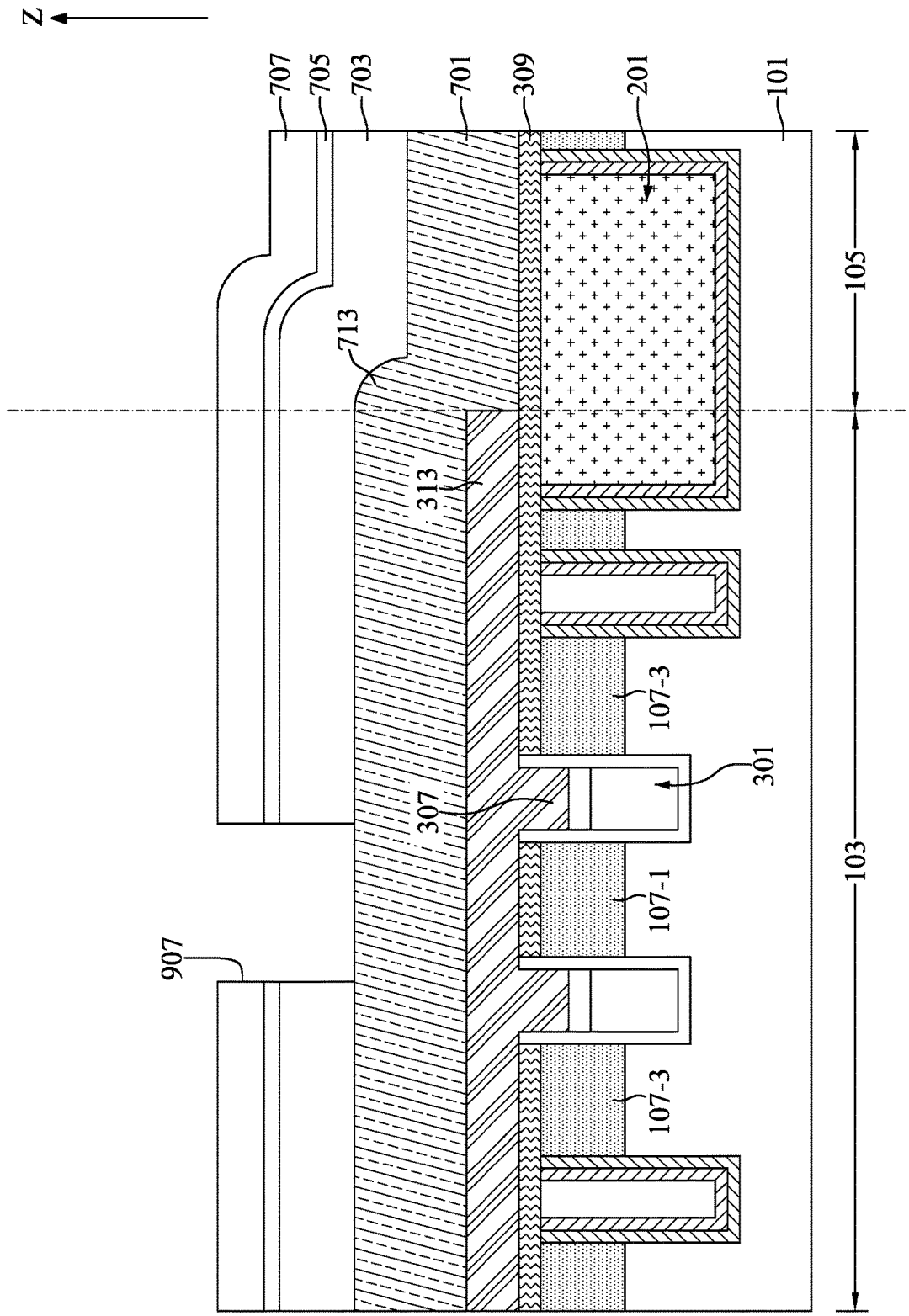

With reference to FIG. 16, a second hard mask etch process may be performed to form a hard mask opening 907 along the fourth hard mask layer 707, the third hard mask layer 705, and the second hard mask layer 703. After the second hard mask etch process, the pattern of the bit line contact 401 may be transferred to the fourth hard mask layer 707, the third hard mask layer 705, and the second hard mask layer 703. The anti-reflective coating layer 711 and the third mask layer 709 may be removed after the formation of the hard mask opening 907.

Figure 17:
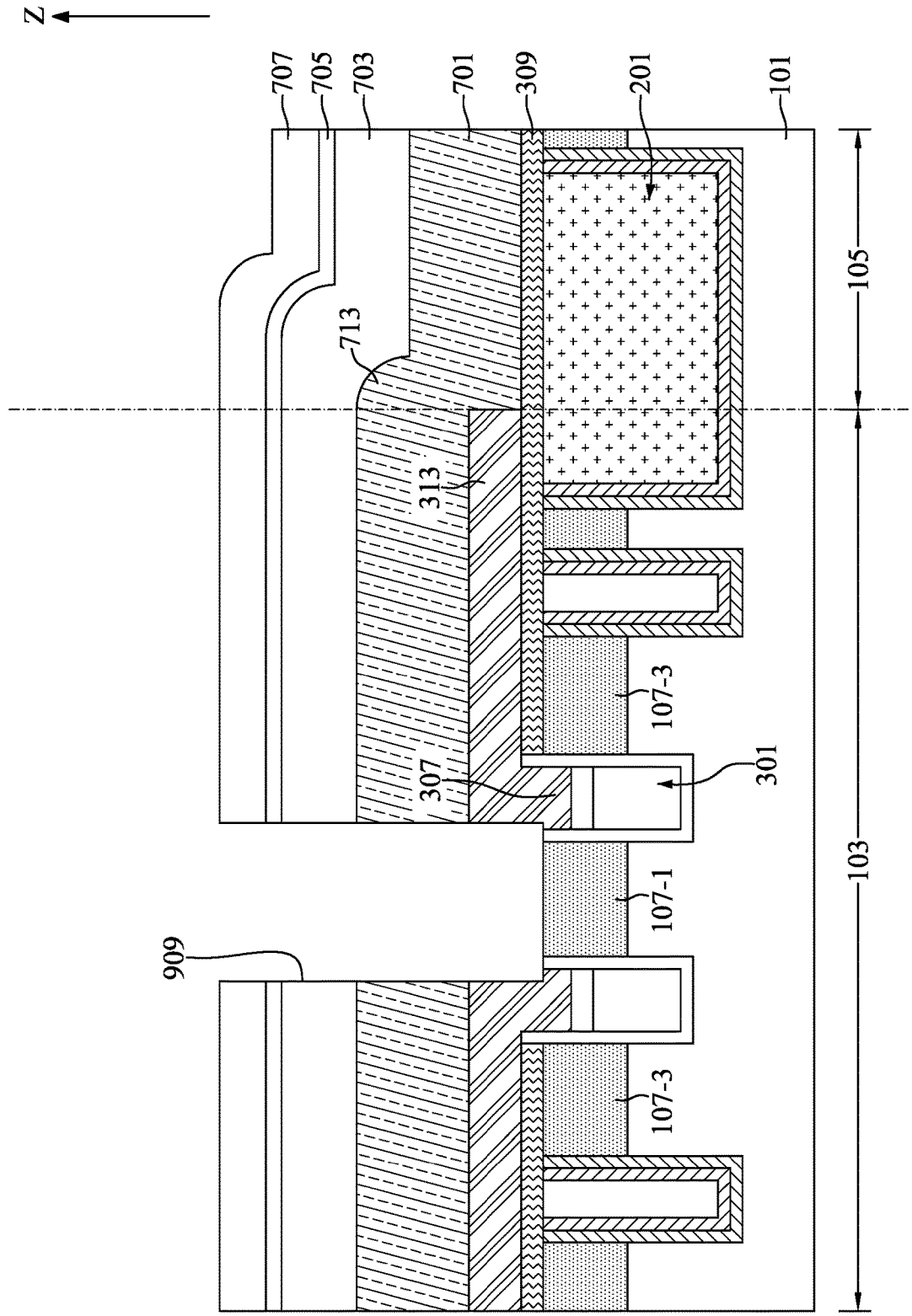

With reference to FIG. 17, a bit line contact etch process may be performed to extend the hard mask opening 907 to the upper portion of the substrate 101. That is, the pattern of the bit line contact may be transferred to the first hard mask layer 401 and the substrate 101. After the bit line contact etch process, the hard mask opening 907 may be turned into a bit line contact opening 909. The portions of the word line capping layers 307, the source region 107-1, and the portions of the word line dielectric layers 303 may be exposed through the bit line contact opening 909.

Figure 18:
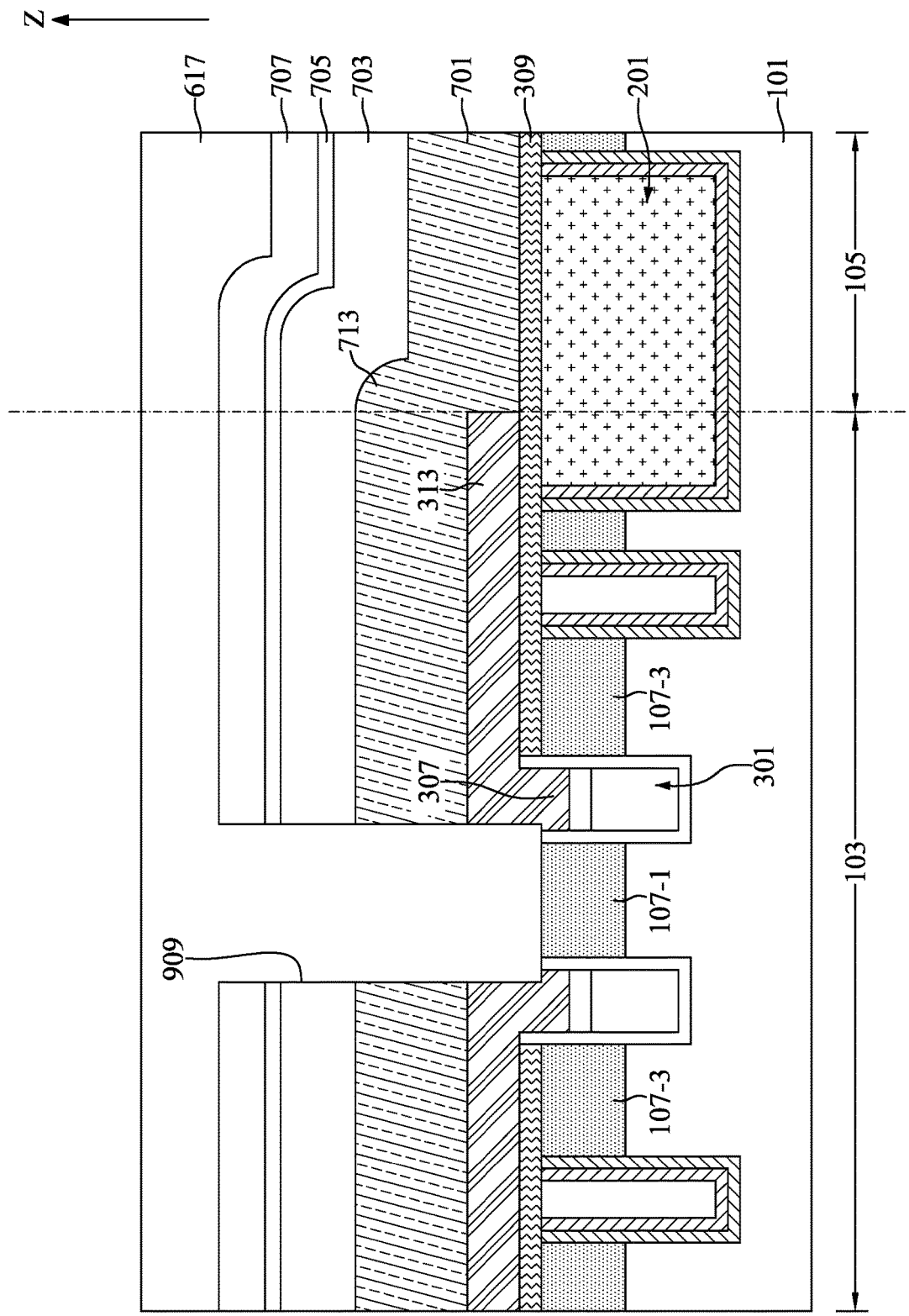

With reference to FIG. 18, a layer of first conductive material 617 may be formed to completely fill the bit line contact opening 909 and cover the fourth hard mask layer 707. The first conductive material 617 may be polycrystalline silicon, polycrystalline germanium, polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof.

Figure 19:
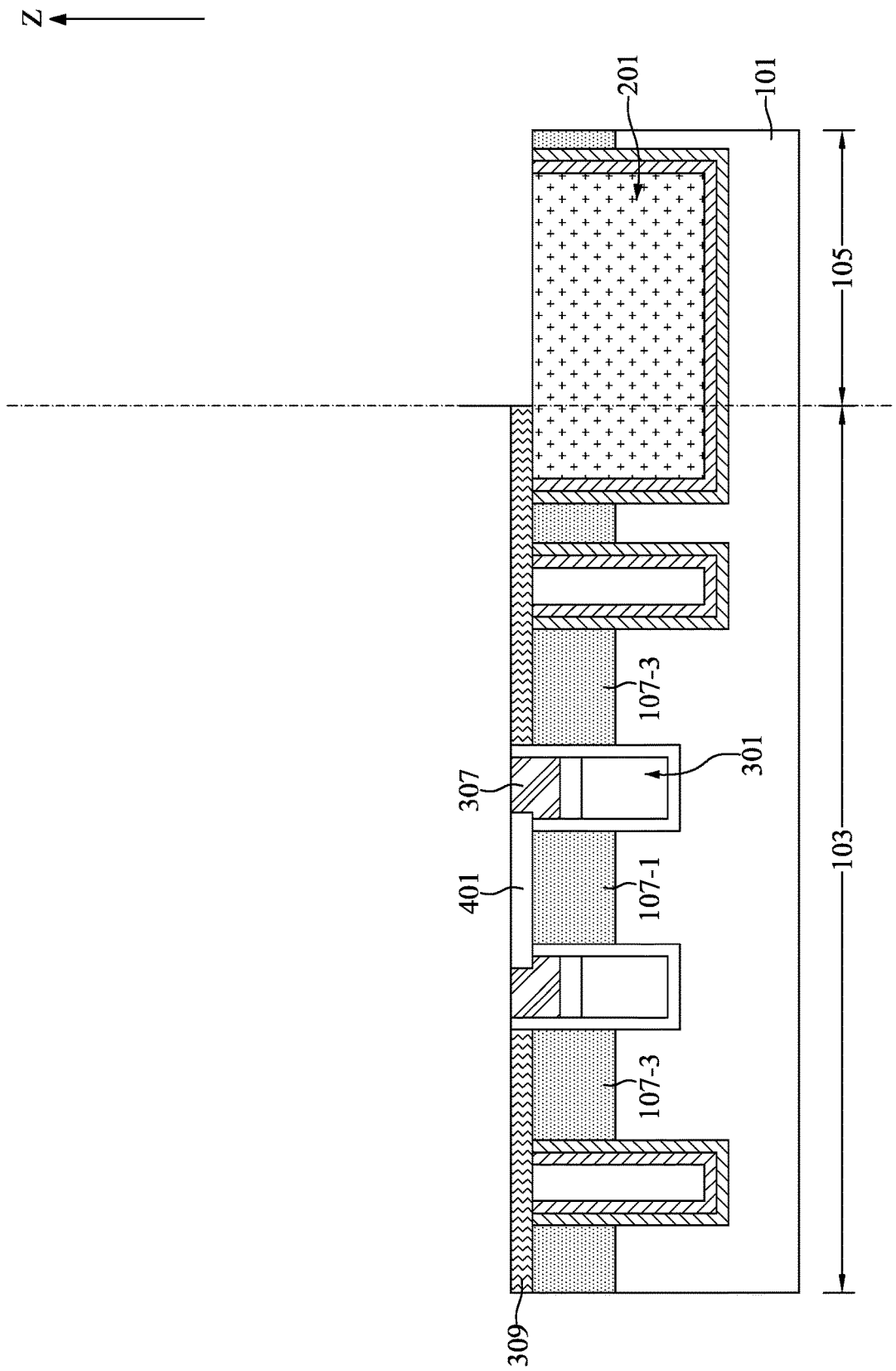

With reference to FIG. 19, a planarization process, such as chemical mechanical polishing, may be performed until the top surface of the word line hard mask layer 309 is exposed to remove excess material and concurrently form the bit line contact 401. The bit line contact 401 may be formed between the word line structures 301 and may be electrically coupled to the source region 107-1. The top surface of the bit line contact 401 and the top surface of the word line hard mask layer 309 may be substantially coplanar.

With reference to FIG. 1 and FIGS. 20 to 22, at step S17, a gate electrode layer 501 may be formed on the peripheral area 105.

Figure 20:
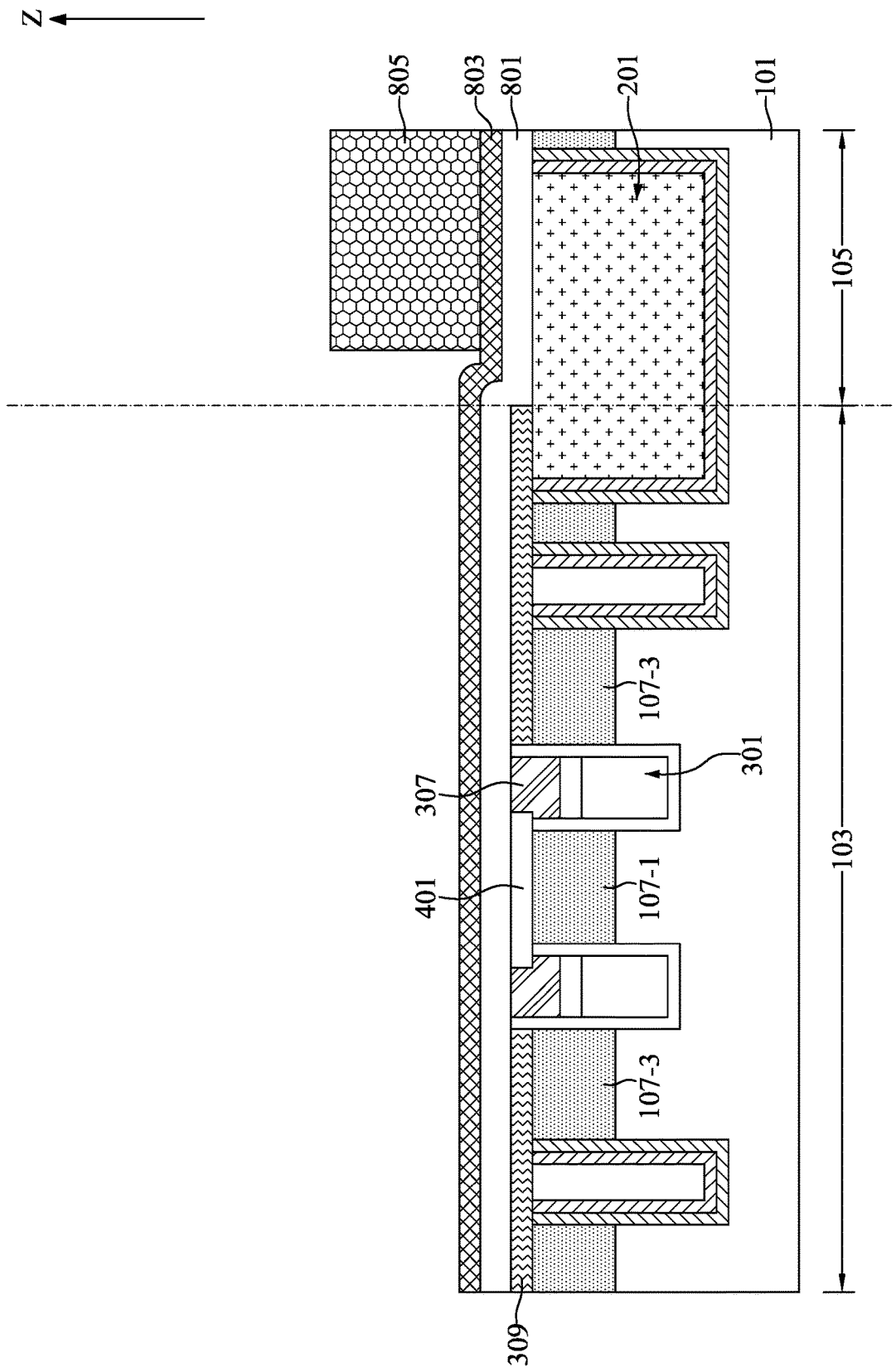

With reference to FIG. 20, a layer of second conductive material 801 and a layer of third insulating material 803 may be sequentially formed over the array area 103 and the peripheral area 105. The second conductive material 801 may be, for example, polycrystalline silicon, polycrystalline germanium, or polycrystalline silicon germanium but is not limited thereto. The third insulating material 803 may be, for example, an oxide such as silicon oxide, silicon nitride, or silicon nitride oxide but is not limited thereto. A fourth mask layer 805 may be formed on the layer of third insulating material 803 and may only cover a portion of the peripheral area 105. The fourth mask layer 805 may be a photoresist layer.

Figure 21:
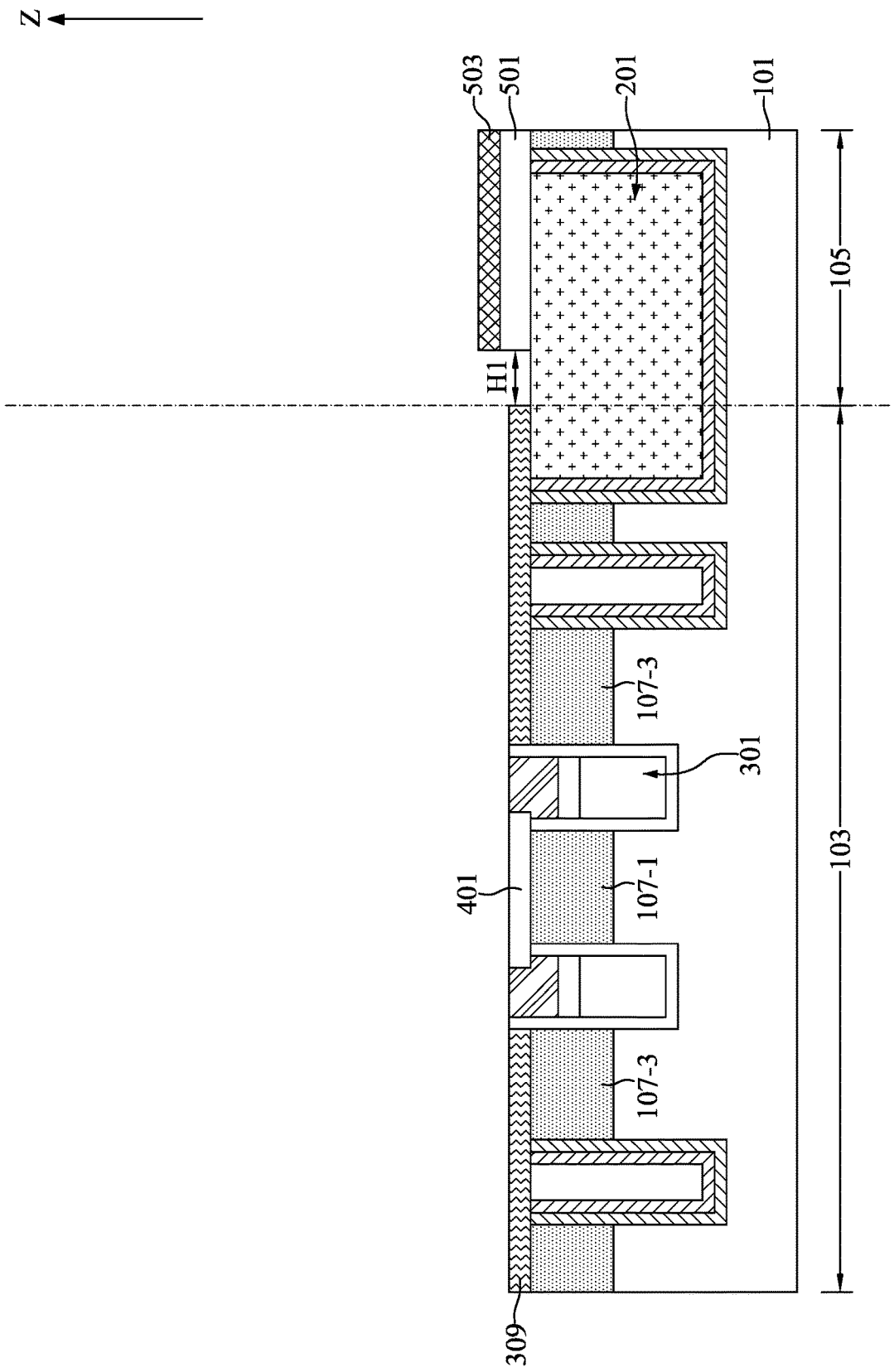

With reference to FIG. 21, an array etch process may be performed to remove the portions, which are not underlying the fourth mask layer 805, of the layer of second conductive material 801 and the layer of third insulating material 803. After the array etch process, the remained layer of second conductive material 801 may be turned into the gate electrode layer 501. The remained layer of third insulating material 803 may be turned into a peripheral protection layer 503 on the gate electrode layer 501. The peripheral protection layer 503 may prevent the gate electrode layer 501 from being damage during the array etch process. The gate electrode layer 501 may be separated from the word line hard mask layer 309. In some embodiments, a horizontal distance H1 between the gate electrode layer 501 and the word line hard mask layer 309 may be less than a thickness of the first hard mask layer 701.

Figure 22:
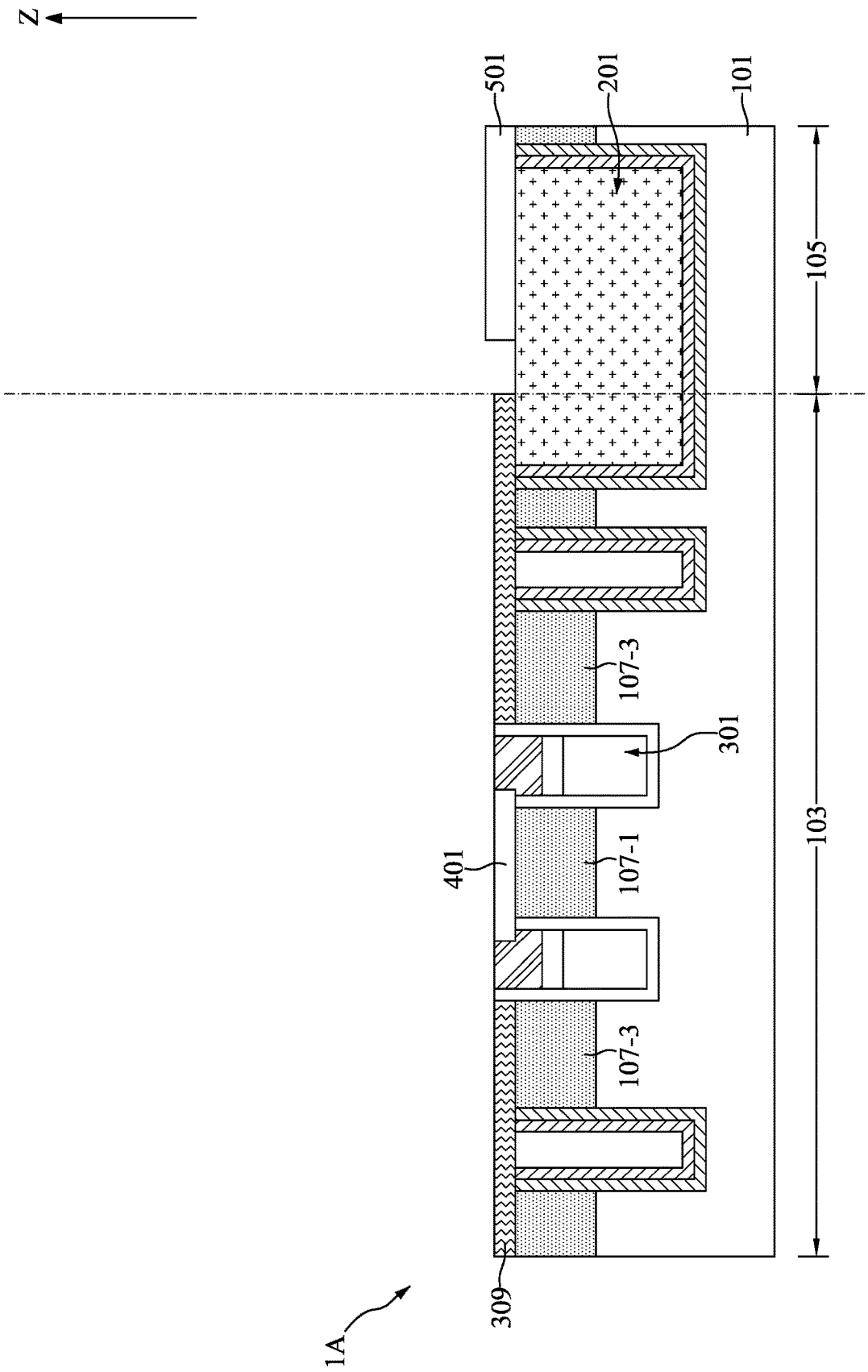

With reference to FIG. 22, a wet etch process may be performed to remove the peripheral protection layer 503. Elements such as inter-layer dielectrics, bit lines, capacitor contacts, and capacitors (Not shown) may be formed over the intermediate semiconductor device illustrated in FIG. 22.

Figure 23:
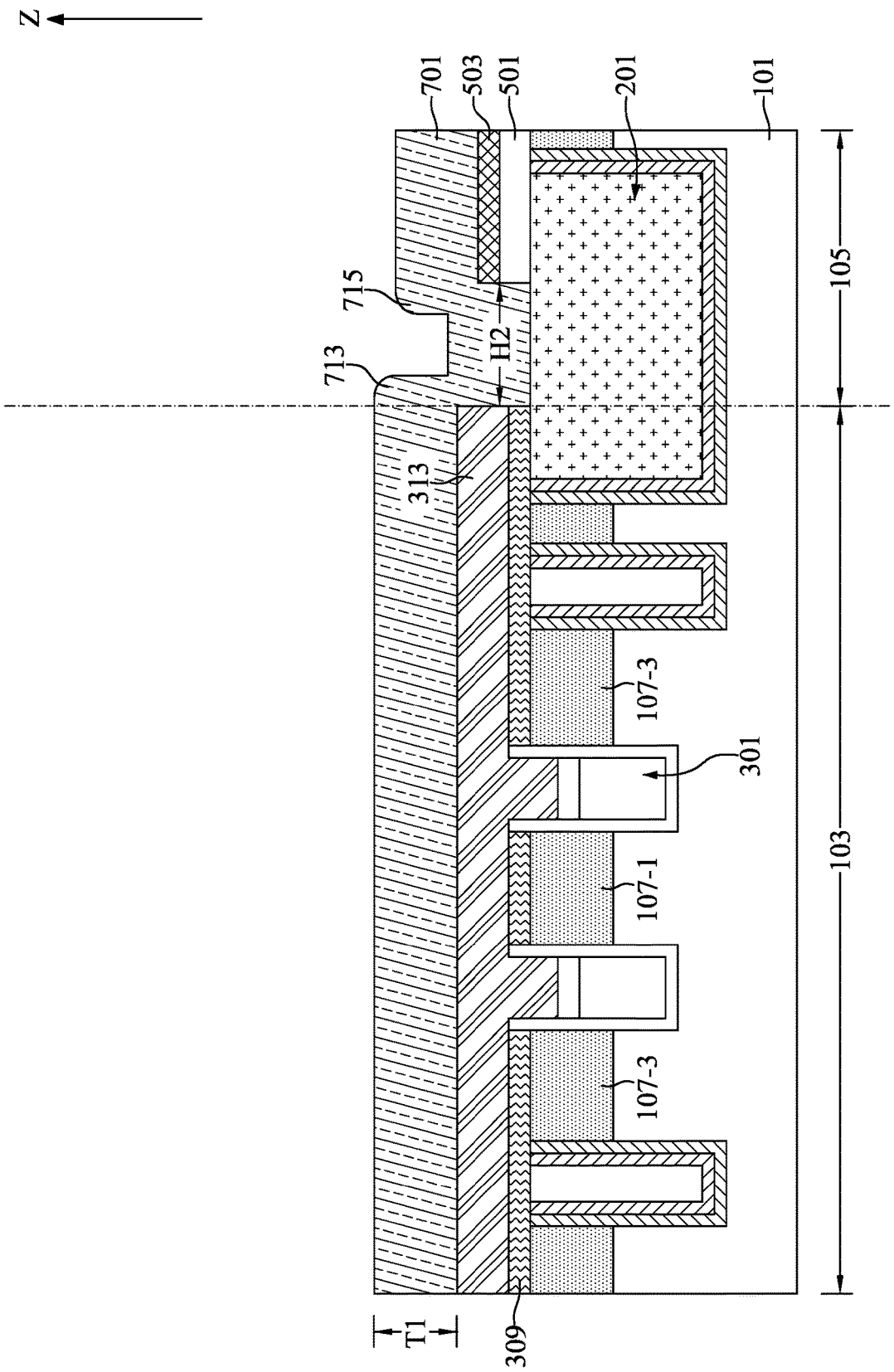
FIG. 23 illustrates, in a schematic cross-sectional view diagram, an intermediate semiconductor device in accordance with another embodiment of the present disclosure.

FIG. 23 illustrates, in a schematic cross-sectional view diagram, an intermediate semiconductor device in accordance with another embodiment of the present disclosure.

With reference to FIG. 23, the peripheral protection layer 503 and the gate electrode layer 501 may be formed before the bit line contact 401 and after the word line structures 301. The first hard mask layer 701 may be deposited over the array area 103 and the peripheral area 105. The step height 713 may be formed due to the presence of the word line protection layer 313 and the word line hard mask layer 309. The step height 715 may be formed due to the presence of the gate electrode layer 501 and the peripheral protection layer 503.

In some embodiments, when the horizontal distance H2 between the gate electrode layer 501 and the word line hard mask layer 309 is less than three times of the thickness T1 of the first hard mask layer 701, the stresses originating from the step heights 713, 715 may accumulate during the formation of the first hard mask layer 701 and defects such as cracks may occur in the first hard mask layer 701. In addition, the space between the gate electrode layer 501, the word line hard mask layer 309, the peripheral protection layer 503, and the word line protection layer 313 may be filled with void during the deposition of the first hard mask layer 701.

In some embodiments, the horizontal distance H2 between the gate electrode layer 501 and the word line hard mask layer 309 may be greater than or equal to three times of the thickness T1 of the first hard mask layer 701. Accordingly, the stresses originating from the step heights 713, 715 may be alleviated. Therefore, defects of the semiconductor device may be reduced.

One aspect of the present disclosure provides a method for fabricating semiconductor device including providing a substrate including an array area and a peripheral area adjacent to the array area, forming word line structures and source/drain regions in the array area, and a word line protection layer on the array area, forming a first hard mask layer over the substrate and having a step height adjacent to a border between the array area and the peripheral area, forming a bit line contact in the array area and between the word line structures by using the first hard mask layer as a pattern guide, and forming a gate electrode layer on the peripheral area.

Another aspect of the present disclosure provides a semiconductor device including a substrate including an array area and a peripheral area adjacent to the array area, word line structures positioned in the array area, a word line hard mask layer positioned on the array area, a word line protection layer positioned on the word line hard mask layer, a gate electrode layer positioned on the peripheral area and separated from the word line hard mask layer and the word line protection layer, a peripheral protection layer positioned on the gate electrode layer, and a first hard mask layer positioned over the array area and the peripheral area. A horizontal distance between the word line protection layer and the gate electrode layer is greater than or equal to three times of a thickness of the first hard mask layer.

Due to the design of the semiconductor device of the present disclosure, the stress during formation of the first hard mask layer 701 may be alleviated or eliminated. As a result, the defects of the semiconductor device 1A may be reduced. That is, the yield of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate comprising an array area and a peripheral area adjacent to the array area;
word line structures positioned in the array area;
a word line hard mask layer positioned on the array area;
a word line protection layer positioned on the word line hard mask layer;
a gate electrode layer positioned on the peripheral area and separated from the word line hard mask layer and the word line protection layer;
a peripheral protection layer positioned on the gate electrode layer; and
a first hard mask layer positioned over the array area and the peripheral area;
wherein a horizontal distance between the word line protection layer and the gate electrode layer is greater than or equal to three times of a thickness of the first hard mask layer,
wherein each of the word structures comprises:
word line trenches in the array area;
a word line capping layer filling the word line trenches, wherein the word line capping layer and the word line protection layer are made from the same material and are formed of a single material;
isolation structures in the substrate, wherein each of the word structures further comprises a layer of capping material covering on the word line hard mask layer and filling in the word line trenches at the array area to integrally form the word line capping layer and the word line protection layer;
word line dielectric layers in the word line trenches; and
word line electrodes on the word line dielectric layers and in the word line trenches;
wherein the word line dielectric layers, the word line electrodes, the word line capping layer together form the word line structures, wherein the peripheral area of the substrate is uncovered by the word line capping layer.

2. The semiconductor device of claim 1, wherein the word line electrodes comprise bottom conductive layers and top conductive layers, the bottom conductive layers are formed on the word line dielectric layers and in the word line trenches, and the top conductive layers are formed on the bottom conductive layers.

3. The semiconductor device of claim 2, wherein the bottom conductive layers are formed of polycrystalline silicon, polycrystalline germanium, or polycrystalline silicon germanium.

4. The semiconductor device of claim 3, wherein the top conductive layers are formed of tungsten, aluminum, titanium, copper, titanium nitride, or a combination thereof.

5. The semiconductor device of claim 4, wherein the word line dielectric layers are formed of silicon oxide, silicon nitride, silicon oxynitride, hafnium oxide, or zirconium oxide.

6. The semiconductor device of claim 1, further comprising a bit line contact in the array area and between the word line structures.

7. The semiconductor device of claim 6, wherein the bit line contact is formed of polycrystalline silicon, polycrystalline germanium, polycrystalline silicon germanium, tungsten, cobalt, zirconium, tantalum, titanium, aluminum, ruthenium, copper, metal carbides, metal nitrides, transition metal aluminides, or combinations thereof.

8. The semiconductor device of claim 1, wherein the word line capping layer is formed of silicon oxide, silicon oxynitride, silicon nitride oxide, or a high-k material.

* * * * *